United States Patent
Han et al.

(10) Patent No.: US 10,162,237 B2
(45) Date of Patent: Dec. 25, 2018

(54) DISPLAY DEVICE BEING RESISTANT TO SHORT-CIRCUITING

(71) Applicant: SAMSUNG DISPLAY CO., LTD., Yongin, Gyeonggi-do (KR)

(72) Inventors: Jee Hoon Han, Asan-si (KR); Soo Chul Kim, Cheonan-si (KR); Jae Yong Shin, Asan-si (KR); Jae Hyoung Youn, Hwaseong-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 15/040,096

(22) Filed: Feb. 10, 2016

(65) Prior Publication Data

US 2017/0023839 A1    Jan. 26, 2017

(30) Foreign Application Priority Data

May 15, 2015    (KR) ........................ 10-2015-0067875

(51) Int. Cl.
*H01L 27/12* (2006.01)
*G02F 1/1362* (2006.01)
(Continued)

(52) U.S. Cl.
CPC .. *G02F 1/136286* (2013.01); *G02F 1/133345* (2013.01); *H01L 27/1244* (2013.01);
(Continued)

(58) Field of Classification Search
CPC ........... G02F 1/136286; G02F 1/13394; H01L 27/1244; H01L 27/1248
(Continued)

(56) References Cited

U.S. PATENT DOCUMENTS

| 2003/0063249 A1* | 4/2003 | Hoshino ............. G02F 1/13458 349/149 |
| 2003/0085404 A1* | 5/2003 | Kim .................... G02F 1/13458 257/72 |

(Continued)

FOREIGN PATENT DOCUMENTS

| KR | 1020070002711 | 1/2007 |
| KR | 10201200065976 | 6/2012 |

(Continued)

*Primary Examiner* — Whitney T Moore
*Assistant Examiner* — Herve Assouman
(74) *Attorney, Agent, or Firm* — F. Chau & Associates, LLC

(57) ABSTRACT

A display device includes a first substrate including a display area and a peripheral area disposed in a periphery of the display area. A gate line is disposed in the display area. A data line is insulated from the gate line and intersects the gate line. The data line includes a first portion and a second portion. The first portion is disposed in the display area, and the second portion is connected to the first portion and is disposed in the peripheral area. A thin-film transistor (TFT) is disposed in the display area of the first substrate and is connected to the gate and data lines. A first insulating pattern is disposed on the TFT. A second insulating pattern is disposed in the peripheral area and covers a part of the second portion of the data line. The second insulating pattern includes a same material as the first insulating pattern.

19 Claims, 26 Drawing Sheets

(51) Int. Cl.
*G02F 1/1333* (2006.01)
*G02F 1/1339* (2006.01)

(52) U.S. Cl.
CPC ...... *H01L 27/1248* (2013.01); *G02F 1/13394* (2013.01); *G02F 2001/136222* (2013.01); *G02F 2001/136254* (2013.01); *G02F 2001/136295* (2013.01)

(58) Field of Classification Search
USPC .................................................... 257/72, 43
See application file for complete search history.

(56) References Cited

U.S. PATENT DOCUMENTS

| | | | | |
|---|---|---|---|---|
| 2004/0119901 A1* | 6/2004 | Kang | ............... | G02F 1/133512 349/43 |
| 2005/0024622 A1* | 2/2005 | Kim | ................... | G03F 7/70475 355/75 |
| 2005/0117093 A1* | 6/2005 | Kim | ................. | G02F 1/133514 349/106 |
| 2006/0033857 A1* | 2/2006 | Kim | ................. | G02F 1/136204 349/54 |
| 2006/0067143 A1* | 3/2006 | Kim | ...................... | G02F 1/1362 365/201 |
| 2009/0121228 A1* | 5/2009 | Kim | .................... | G02F 1/13458 257/59 |
| 2009/0140269 A1* | 6/2009 | Song | .................. | G02F 1/13458 257/88 |
| 2010/0033646 A1* | 2/2010 | Baek | ..................... | G02F 1/1345 349/42 |
| 2010/0053530 A1* | 3/2010 | Peng | ................. | G02F 1/136286 349/139 |
| 2010/0270553 A1* | 10/2010 | Choi | ................ | G02F 1/136209 257/59 |
| 2011/0180798 A1* | 7/2011 | Shim | ................. | G02F 1/133512 257/59 |
| 2014/0104997 A1 | 4/2014 | Shibata et al. | | |

FOREIGN PATENT DOCUMENTS

| | | |
|---|---|---|
| KR | 1020130015737 | 2/2013 |
| KR | 1020130097879 | 9/2013 |

* cited by examiner

DISPLAY DEVICE BEING RESISTANT TO SHORT-CIRCUITING

CROSS-REFERENCE TO RELATED APPLICATION(S)

This application claims priority under 35 U.S.C. § 119 to Korean Patent Application No. 10-2015-0067875, filed on May 15, 2015, in the Korean Intellectual Property Office, the disclosure of which is incorporated by reference herein in its entirety.

TECHNICAL FIELD

Exemplary embodiments of the invention relate to a display device, and more particularly, exemplary embodiments of the invention relate to a display device being resistant to short-circuiting.

DISCUSSION OF THE RELATED ART

A liquid crystal display (LCD) generally includes an array substrate on which a plurality of gate lines, a plurality of data lines, and a plurality of pixels are formed. The LCD may include a gate driving circuit which outputs gate signals to the gate lines, and a data driving circuit which outputs data signals to the data lines.

Each of the pixels may include a pixel electrode and a thin-film transistor (TFT). The TFT may be connected to a corresponding pixel electrode, one of the data lines, and one of the gate lines. The TFT drives the corresponding pixel.

The LCD may be subject to various tests during the fabrication process. For example, the LCD may be tested in either a contact manner or a contactless manner to check whether the data lines are open or short-circuited.

During the tests, however, the data lines may be physically damaged. Accordingly, the reliability of the LCD may be decreased.

SUMMARY

According to an exemplary embodiment of the invention, a display device includes a first substrate including a display area and a peripheral area disposed in a periphery of the display area. A gate line is disposed in the display area of the first substrate. A data line is insulated from the gate line and intersects the gate line, the data line including a first portion and a second portion. The first portion is disposed in the display area of the first substrate, and the second portion is connected to the first portion and is disposed in the peripheral area of the first substrate. A thin-film transistor (TFT) is disposed in the display area of the first substrate and is connected to the gate line and the data line. A first insulating pattern is disposed on the TFT. A second insulating pattern is disposed in the peripheral area of the first substrate and covers at least part of the second portion of the data line. The second insulating pattern includes a same material as the first insulating pattern.

In an exemplary embodiment of the invention, the display device further includes a protruding pattern disposed on the second portion of the data line. The second insulating pattern covers the entire protruding pattern.

In an exemplary embodiment of the invention, the protruding pattern includes a same material as the second portion of the data line.

In an exemplary embodiment of the invention, the first insulating pattern is a color filter.

In an exemplary embodiment of the invention, the display device further includes a cell gap spacer disposed on the first insulating pattern. The cell gap spacer overlaps the TFT.

In an exemplary embodiment of the invention, the display device further includes a pixel electrode disposed on the first insulating pattern and connected to the TFT through a contact hole. The contact hole is formed in the first insulating pattern. A second substrate faces the first substrate. A light-blocking member is disposed on a first surface of the second substrate. The first surface of the second substrate faces the first substrate, and the light-blocking member overlaps the TFT and the data line. A common electrode is disposed on the first surface of the second substrate and the light-blocking member.

According to an exemplary embodiment of the invention, a display device includes a first substrate including a display area and a peripheral area disposed in a periphery of the display area. A gate line is disposed in the display area of the first substrate. A data line is insulated from the gate line and intersects the gate line, the data line including a first portion and a second portion. The first portion is disposed in the display area of the first substrate, and the second portion is connected to the first portion and is disposed in the peripheral area of the first substrate. A TFT is disposed in the display area of the first substrate and is connected to the gate line and the data line. A first insulating pattern is disposed on the TFT. A light-blocking member is disposed on the first insulating pattern, the light-blocking member overlapping the data line and the TFT. A second insulating pattern is disposed in the peripheral area of the first substrate and covers at least part of the second portion of the data line. The second insulating pattern includes a same material as the light-blocking member.

In an exemplary embodiment of the invention, the display device further includes a protruding pattern disposed on the second portion of the data line. The second insulating pattern covers the entire protruding pattern.

In an exemplary embodiment of the invention, the protruding pattern includes a same material as the second portion.

In an exemplary embodiment of the invention, the first insulating pattern is a color filter.

In an exemplary embodiment of the invention, the display device further includes a cell gap spacer disposed on the light-blocking member. The cell gap spacer overlaps the TFT.

In an exemplary embodiment of the invention, the cell gap spacer includes a same material as the light-blocking member.

In an exemplary embodiment of the invention, the display device further includes a pixel electrode disposed on the first insulating pattern and connected to the TFT through a contact hole. The contact hole is formed in the first insulating pattern. A second substrate faces the first substrate. A common electrode is disposed on a first surface of the second substrate and the light-blocking member.

According to an exemplary embodiment of the invention, a display device includes a first substrate including a display area and a peripheral area disposed in a periphery of the display area. A gate line is disposed in the display area of the first substrate. First and second data lines are insulated from the gate line and intersect the gate line. The first data line includes a first portion disposed in the display area of the first substrate, and a second portion connected to the first portion. The second portion of the first data line is disposed in the peripheral area of the first substrate. The second data line includes a first portion disposed in the display area of the first substrate, and a second portion connected to the first portion. The second portion of the second data line is disposed in the peripheral area of the first substrate. A first TFT is disposed in the display area of the first substrate and is connected to the gate line and the first data line. A first insulating pattern is disposed on the first TFT, the first insulating pattern including a first contact hole. A first pixel electrode is disposed on the first insulating pattern and is connected to the first TFT through the first contact hole. A second TFT is disposed in the display area of the first substrate and is connected to the gate line and the second data line. A second insulating pattern is disposed on the second TFT, the second insulating pattern including a second contact hole. A second pixel electrode is disposed on the second insulating pattern and is connected to the second TFT through the second contact hole. A third insulating pattern is disposed in the peripheral area of the first substrate and covers at least part of the second portion of the first data line. A fourth insulating pattern is disposed in the peripheral area of the first substrate and covers at least part of the second portion of the second data line. At least one of the third and fourth insulating patterns includes a same material as the first insulating pattern.

In an exemplary embodiment of the invention, the display device further includes a protruding pattern disposed on the second portion of the first data line. The third insulating pattern covers the entire protruding pattern.

In an exemplary embodiment of the invention, the protruding pattern includes a same material as the second portion of the first data line.

In an exemplary embodiment of the invention, the first insulating pattern is a first color filter, and the second insulating pattern is a second color filter having a different color from the first color filter.

In an exemplary embodiment of the invention, the third insulating pattern includes a same material as the first and fourth insulating patterns.

In an exemplary embodiment of the invention, the third insulating pattern includes a same material as the first insulating pattern, and the fourth insulating pattern includes a same material as the second insulating pattern.

In an exemplary embodiment of the invention, the third insulating pattern includes a same material as the second insulating pattern, and the fourth insulating pattern includes a same material as the first insulating pattern.

BRIEF DESCRIPTION OF THE DRAWINGS

The above and other features and aspects of the inventive concept will become more apparent by describing in detail exemplary embodiments thereof with reference to the accompanying drawings, in which.

DETAILED DESCRIPTION OF THE EMBODIMENTS

Figure 1:
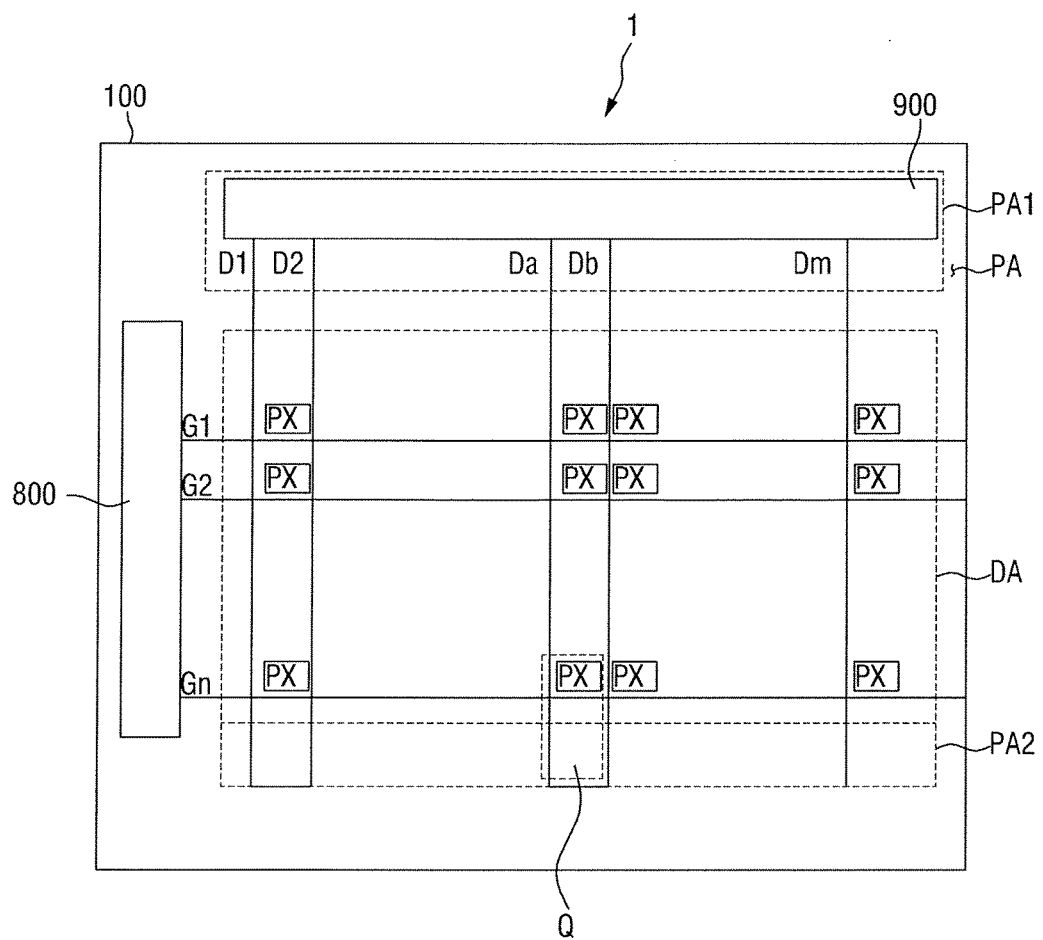
FIG. 1 is a layout view of a display device, according to an exemplary embodiment of the invention.

Features of the inventive concept and methods of manufacturing the same may be understood more readily with reference to the following detailed description of exemplary embodiments of the invention and the accompanying drawings. The inventive concept may, however, be embodied in many different forms and should not be construed as being limited to the exemplary embodiments thereof set forth herein. A detailed description of these embodiments is provided to convey the inventive concept to those skilled in the art. Like reference numerals may refer to like elements throughout the specification.

The terminology used herein is for the purpose of describing exemplary embodiments and is not intended to be limiting of the inventive concept. As used herein, the singular forms "a", "an" and "the" are intended to include the plural forms as well, unless the context clearly indicates otherwise.

It will be understood that when an element or layer is referred to as being "on", "connected to" or "coupled to" another element or layer, it can be directly on, connected or coupled to the other element or layer, or intervening elements or layers may be present. As used herein, the term "and/or" includes any and all combinations of one or more of the associated listed items.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein are to be interpreted accordingly.

Exemplary embodiments of the invention will hereinafter be described with reference to the accompanying drawings.

FIG. 1 is a layout view of a display device, according to an exemplary embodiment of the invention.

Referring to FIG. 1, a display device 1 may include an array substrate and an opposite substrate which faces the array substrate. The array substrate may include a first substrate 100, a plurality of gate lines including G1, and G2 to Gn (e.g., the gate lines G1 to Gn, where n is a positive integer), a plurality of data lines including D1 and D2 to Da, and Db to Dm (e.g., the data lines D1 to Dm, where a, b, and m are positive integers satisfying the following inequality: a<b<m). The data lines D1 to Dm are insulated from, and intersect the gate lines G1 to Gn. The array substrate may include a gate driving unit 800, and a data driving unit 900.

The first substrate 100 may include a display area DA in which a plurality of pixels PX each having a thin-film transistor (TFT) and a pixel electrode are defined, and a peripheral area PA which accounts for the entire surface area of first substrate 100 except for the display area DA.

The gate lines G1, to Gn, which extend in a first direction (e.g., a horizontal direction, as illustrated in FIG. 1), and the data lines D1 to Dm, which are insulated from, and intersect the gate lines G1 to Gn, may be disposed in the display area DA of the first substrate 100. The data lines D1 to Dm may extend in a second direction (e.g., a vertical direction) that crosses the first direction. The pixels PX may be respectively disposed at the intersections between the gate lines G1 to Gn and the data lines D1 to Dm.

The gate driving unit 800, which applies a gate voltage to each of the gate lines G1 to Gn, and the data driving unit 900, which applies a data voltage to each of the data lines D1 to Dm, may be disposed in the peripheral area PA. In an exemplary embodiment of the invention, at least one of the gate driving unit 800 and the data driving unit 900 may be mounted on the first substrate 100. However, the inventive concept is not limited thereto. For example, according to an exemplary embodiment of the invention, at least one of the gate driving unit 800 and the data driving unit 900 need not be mounted on the first substrate 100. When the data driving unit 900 is not mounted on the first substrate 100, a plurality of pads for electrically connecting the data driving unit 900 and the data lines D1 to Dm may be provided in the peripheral area PA. For convenience of explanation, it is assumed that the data driving unit 900 is disposed in the peripheral area PA of the first substrate 100.

At least some of the data lines D1 to Dm may extend into the peripheral area PA. The peripheral area PA is disposed in a periphery of the display area DA. In an exemplary embodiment of the invention, the part of the peripheral area PA where the data driving unit 900 is disposed is referred to as a first peripheral area PA1. The part of the peripheral area PA that is opposite to the first peripheral area PA1 is referred to as a second peripheral area PA2. The display area DA is disposed between the first and second peripheral areas PA and PA2. In an exemplary embodiment of the invention, at least some of the data lines D1 to Dm may extend not only into the first peripheral area PA1 but also into the second peripheral area PA2. In an exemplary embodiment of the invention, the second peripheral area PA2 may be an area for testing the display device 1 for whether the data lines D1 to Dm are open or short-circuited.

Figure 2:
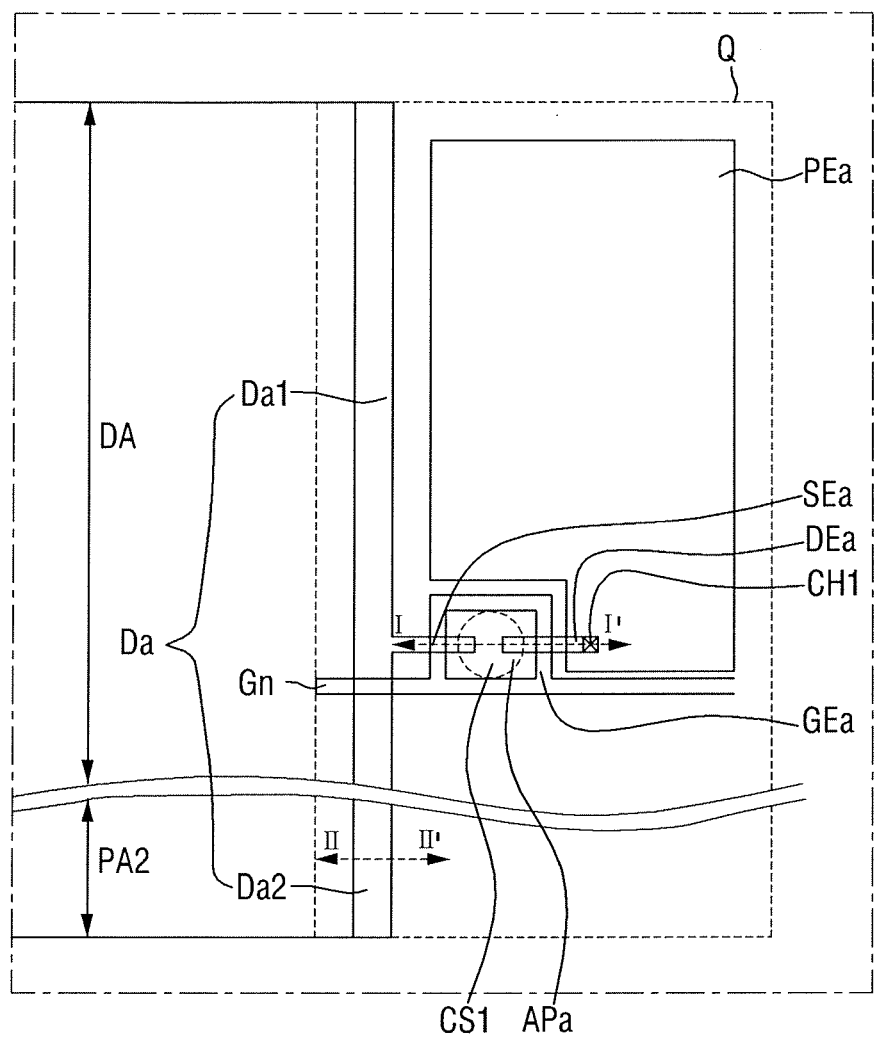
FIG. 2 is an enlarged plan view of part Q of FIG. 1, according to an exemplary embodiment of the invention.
Figure 3:
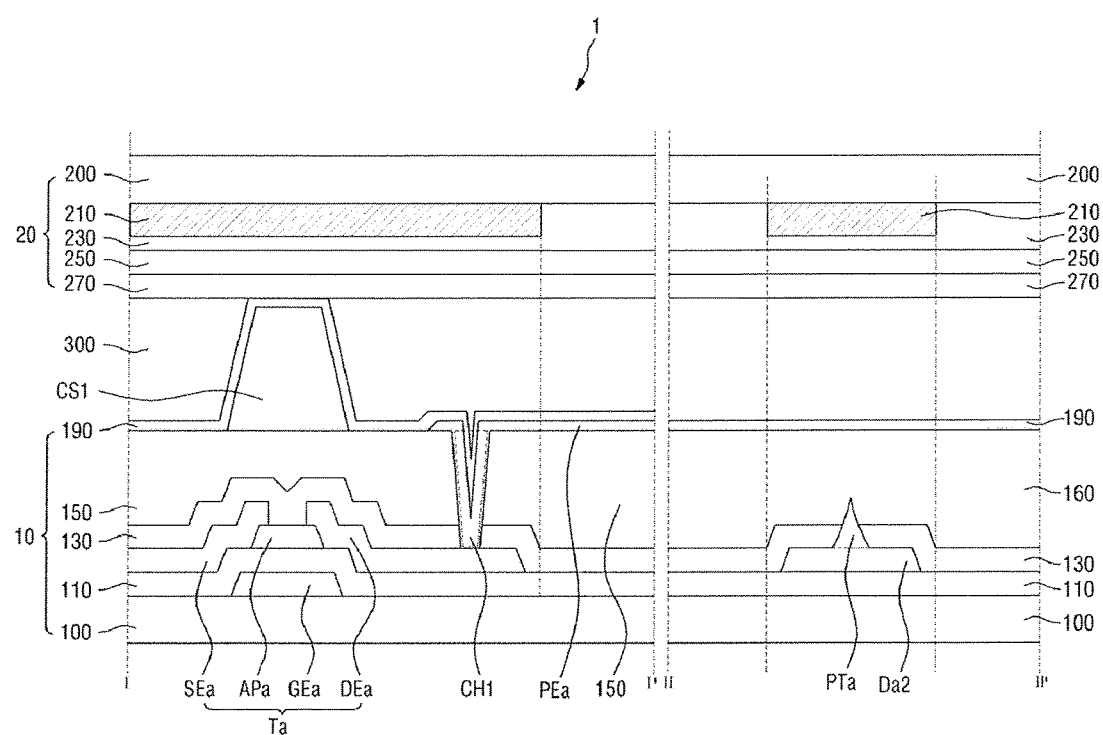
FIG. 3 is a cross-sectional view taken along lines I-I' and II-II' of FIG. 2, according to an exemplary embodiment of the invention.

FIG. 2 is an enlarged plan view of part Q of FIG. 1, according to an exemplary embodiment of the invention. For example, FIG. 2 illustrates an enlarged plan view illustrating a single pixel PX and part of the second peripheral area PA2. FIG. 3 is a cross-sectional view taken along lines I-I' and II-II' of FIG. 2, according to an exemplary embodiment of the invention.

Referring to FIGS. 1 to 3, the display device 1 may include an array substrate 10, an opposite substrate 20 which faces the array substrate 10, and a liquid crystal layer 300 disposed between the array substrate 10 and the opposite substrate 20.

The array substrate 10 may include the first substrate 100, a gate insulating layer 110, a first gate line Gn, from among the gate lines G1 to Gn, a first data line Da, from among the data lines D1 to Dm, a first TFT Ta which is a switching device, a passivation layer 130, a first insulating pattern 150, a second insulating pattern 160, a first pixel electrode PEa, a first cell gap spacer CS1, and a first alignment layer 190.

The first substrate 100 may be a transparent insulating substrate. For example, the first substrate 100 may be implemented as a glass substrate, a quartz substrate, or a transparent resin substrate. The first substrate 100 may contain a polymer with high thermal resistance. For example, the first substrate 100 may contain polyethersulphone (PES), polyacrylate (PAR), polyetherimide (PEI), polyethylene napthalate (PEN), polyethyeleneterepthalate (PET), polyphenylene sulfide (PPS), polyallylate, polyimide (PI), polycarbonate (PC), cellulose triacetate, cellulose acetate propionate (CAP), or poly(arylene ether sulfone), or a combination thereof.

In an exemplary embodiment of the invention, the first substrate 100 may be flexible. For example, the first substrate 100 may be deformable through rolling, folding or bending.

The first substrate 100 may include the display area DA, and the peripheral area PA which includes the first peripheral area PA1 and the second peripheral area PA2.

The first gate line Gn may extend on the first substrate 100 in the first direction (e.g., the horizontal direction, as illustrated in FIGS. 2 and 3). The first gate line Gn may be disposed in the display area DA of the first substrate 100, and may at least partially extend into the peripheral area PA of the first substrate 100. The first gate line Gn may be formed of an element selected from among tantalum (Ta), tungsten (W), titanium (Ti), molybdenum (Mo), aluminum (Al), copper (Cu), chromium (Cr), and neodymium (Nd), an alloy of at least one of the elements as a main component, or a compound material including at least one of the elements as a main component. However, the inventive concept is not limited thereto.

The gate insulating layer 110 may be formed on the first substrate 100 to cover the first gate line Gn. The gate insulating layer 110 may be disposed not only on the display area DA, but also on the second peripheral area PA2 of the first substrate 100. In an exemplary embodiment of the invention, the gate insulating layer 110 may be formed of an inorganic insulating material, for example, silicon oxide ($SiO_2$) or silicon nitride (SiNx).

The first data line Da may be disposed on the gate insulating layer 110, and may extend in the second direction (e.g., the vertical direction, as illustrated in FIGS. 2 and 3) that crosses the first direction. The first data line Da may be insulated from, and intersect the first gate line Gn. The first data line Da may be disposed in the display area DA of the first substrate 100, and may at least partially extend into the peripheral area PA of the first substrate 100. The first data line Da may include a first portion Da1, which is disposed in the display area DA of the first substrate 100, and a second portion Da2, which is connected to the first portion Da1 and is disposed in the second peripheral area PA2 of the first substrate 100. In an exemplary embodiment of the invention, the first data line Da may be formed of a metal such as silver (Ag), gold (Au), Cu, nickel (Ni), platinum (Pt), palladium (Pd), iridium (Ir), rhodium (Rh), W, Al, Ta, Mo, cadmium (Cd), zinc (Zn), iron (Fe), Ti, silicon (Si), germanium (Ge), zirconium (Zr), or barium (Ba), an alloy of at least one of the metals, or a nitride of at least one of the metals. However, the inventive concept is not limited thereto.

In an exemplary embodiment of the invention, a first protruding pattern PTa may be disposed on the second portion Da2 of the first data line Da. The first protruding pattern PTa may be a burr or a spike formed at the second portion Da2 during an open/short-circuit test of the first data line Da. The first protruding pattern PTa and the first data line Da may be formed of the same material.

The first TFT Ta may be disposed in the display area DA of the first substrate 100. The first TFT Ta may include a first gate electrode GEa which is connected to the first gate line Gn. The first TFT Ta may include a first active pattern APa which overlaps the first gate electrode GEa and is disposed on the gate insulating layer 110. The first TFT Ta may include a first source electrode SEa, which is connected to the first portion Da1 of the first data line Da, and is disposed on the first active pattern APa to overlap the first active pattern APa. The first TFT Ta may include a first drain electrode DEa which is disposed on the first active pattern APa to overlap the first active pattern APa. In an exemplary embodiment of the invention, the first gate electrode GEa may be formed of the same material as the first gate line Gn, and the first source electrode SEa and the first drain electrode DEa may be formed of the same material as the first data line Da. The first active pattern APa may be formed of an amorphous semiconductor, a microcrystalline semiconductor, a polycrystalline semiconductor, or an oxide semiconductor.

The passivation layer 130 may be disposed on the gate insulating layer 110 to cover the first data line Da, the first source electrode SEa, and the first drain electrode DEa. The passivation layer 130 might cover not only the first portion Da1 of the first data line Da, which is disposed on the display area DA of the first substrate 100, but also the second portion Da2 of the first data line Da, which is disposed on the second peripheral area PA2. In an exemplary embodiment of the invention, the passivation layer 130 may be formed of an inorganic insulating material, for example, $SiO_2$ or $SiN_x$. In an exemplary embodiment of the invention, the passivation layer 130 may be optionally omitted. In an exemplary embodiment of the invention, the passivation layer 130 might not be able to completely cover the first protruding pattern PTa of the second portion Da2. For example, the first protruding pattern PTa may protrude from the second portion Da2, extend through the passivation layer 130, and extend beyond the top of the passivation layer 130.

The first insulating pattern 150 may be disposed in the display area DA of the first substrate 100, and may cover the first TFT Ta. The first insulating pattern 150 may planarize the array substrate 10. In an exemplary embodiment of the invention, the first insulating pattern 150 may be disposed on the passivation layer 130. The first passivation layer 130 covers the first data line Da, the first source electrode SEa, and the first drain electrode DEa.

In an exemplary embodiment of the invention, the first insulating pattern 150 may be formed of an organic insulating material, and the organic insulating material may contain a photosensitive organic composition. The first insulating pattern 150 may be a color filter. The color filter may be formed of a photosensitive organic composition comprising a pigment for realizing a color. For example, the color filter may contain a photosensitive organic composition comprising one of a red pigment, a green pigment and a blue pigment. Accordingly, the color filter may be a red, green or blue color filter.

The second insulating pattern 160 may be disposed on the second peripheral area PA2 of the first substrate 100, and may cover at least part of the second portion Da2 of the first data line Da.

The second insulating pattern 160 may cover the entire first protruding pattern PTa. The part of the first protruding pattern PTa that protrudes above the passivation layer 130 may be covered by the second insulating pattern 160. For example, the first protruding pattern PTa may be completely covered by the second insulating pattern 160 and thus may not be exposed over the top of the second insulating pattern 160.

In an exemplary embodiment of the invention, the second insulating pattern 160 may be formed of the same material as the first insulating pattern 150, and the first and second insulating patterns 150 and 160 may be formed during the same process. For example, when the first insulating pattern 150 is a color filter, the second insulating pattern 160 may also be a color filter, and may have the same color as the first insulating pattern 150. When the first insulating pattern 150 is formed by applying a photosensitive organic composition comprising a pigment for realizing a color and patterning the photosensitive composition using a mask, the second insulating pattern 160 may be formed using the same mask used to form the first insulating pattern 150 during the formation of the first insulating pattern 150. For example, the first and second insulating patterns 150 and 160 may be formed by the same mask process.

The first pixel electrode PEa may be disposed on the first insulating pattern 150, and may be formed of a transparent conductive material. The first pixel electrode PEa may contact the first drain electrode DEa through a first contact hole CH1. The first contact hole CH1 penetrates the first insulating pattern 150 and the passivation layer 130. Accordingly, the first pixel electrode PEa may be electrically connected to the first TFT Ta.

The first cell gap spacer CS1 may be disposed on the first insulating pattern 150. The first cell gap spacer CS1 may maintain a gap between the array substrate 10 and the opposite substrate 20. In an exemplary embodiment of the invention, the first cell gap spacer CS1 may be disposed to at least partially overlap the first TFT Ta.

The first alignment layer 190 may be disposed on the first insulating pattern 150, the first cell gap spacer CS1, the first pixel electrode PEa, and the second insulating pattern 160. For example, the first alignment layer 190 may be formed on the entire surface of the array substrate 10. The first alignment layer 190 may be uniaxially aligned through, for example, rubbing or optical alignment. Part of the first alignment layer 190 disposed on the first cell gap spacer CS1 may at least partially contact the opposite substrate 20.

The opposite substrate 20 may include a second substrate 200 which faces the array substrate 10, a light-blocking member 210, an overcoat layer 230, a common electrode 250, and a second alignment layer 270.

The second substrate 200, like the first substrate 100, may be a transparent insulating substrate. For example, the second substrate 200 may be implemented as a glass substrate, a quartz substrate, or a transparent resin substrate. The second substrate 200 may include a polymer with high thermal resistance. In an exemplary embodiment of the invention, the second substrate 200 may be flexible. For example, the second substrate 200 may be deformable through rolling, folding or bending.

The light-blocking member 210 may be disposed on a first surface of the second substrate 200 facing the array substrate 10. The light-blocking member 210 may overlap the first gate line Gn, the first data line Da, the first TFT Ta, and the second peripheral area PA2.

The overcoat layer 230 may be formed on the light-blocking member 210 and the second substrate 200, and may planarize the opposite substrate 20. In an exemplary embodiment of the invention, the overcoat layer 230 may be optionally omitted.

The common electrode 250 may be formed on the overcoat layer 230. The common electrode 250 may be formed of a transparent conductive material.

The second alignment layer 270 may be formed on the second substrate 200 where the common electrode 250 is formed. The second alignment layer 270 may be formed on the entire surface of the opposite substrate 20 facing the array substrate 10. The second alignment layer 270 may be uniaxially aligned through, for example, rubbing or optical alignment.

The liquid crystal layer 300 may be interposed between the array substrate 10 and the opposite substrate 20, and may be formed of a liquid crystal composition comprising liquid crystal molecules. In an exemplary embodiment of the invention, the liquid crystal composition may also comprise a reactive mesogen polymer.

FIGS. 4 to 14 are cross-sectional views illustrating a method of fabricating the display device 1 illustrated in FIG. 1, according to an exemplary embodiment of the invention.

Figure 4:
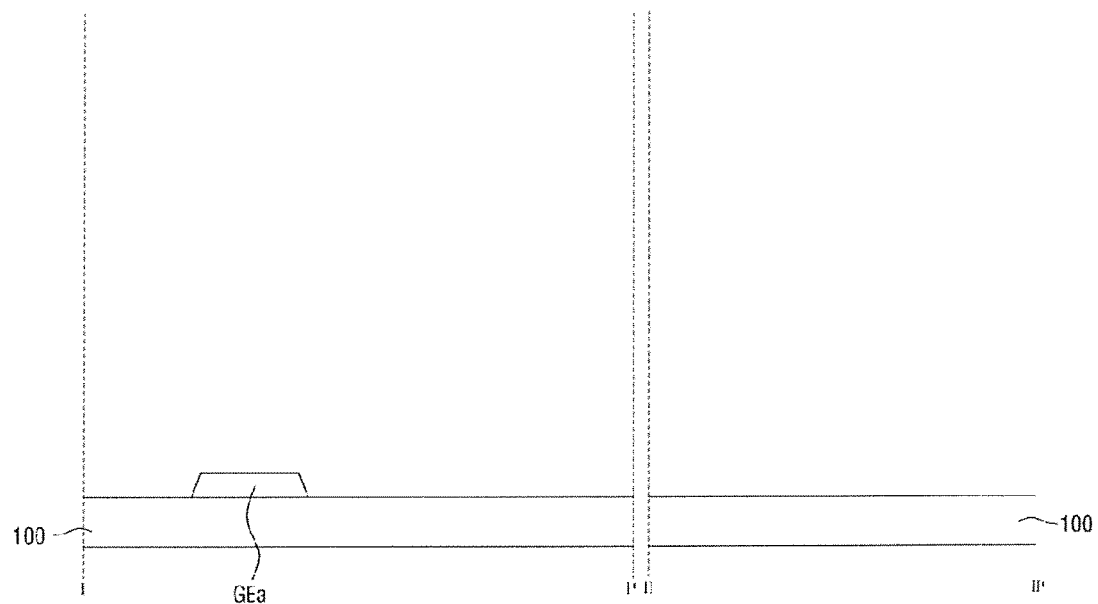
FIGS. 4 to 14 are cross-sectional views illustrating a method of fabricating the display device illustrated in FIG. 1, according to an exemplary embodiment of the invention.

Referring to FIGS. 2 to 4, the first gate line Gn and the first gate electrode GEa are formed by forming a first metal layer on the first substrate 100 and patterning the first metal layer. The first gate electrode GEa may be formed in the display area DA of the first substrate 100, as described above with reference to FIGS. 2 and 3. In an exemplary embodiment of the invention, the first metal layer may contain an element selected from among Ta, W, Ti, Mo, Al, Cu, Cr, and Nd, an alloy material of at least one of the elements as a main component, or a compound material including at least one of the elements as a main component. However, the inventive concept is not limited thereto.

Figure 5:
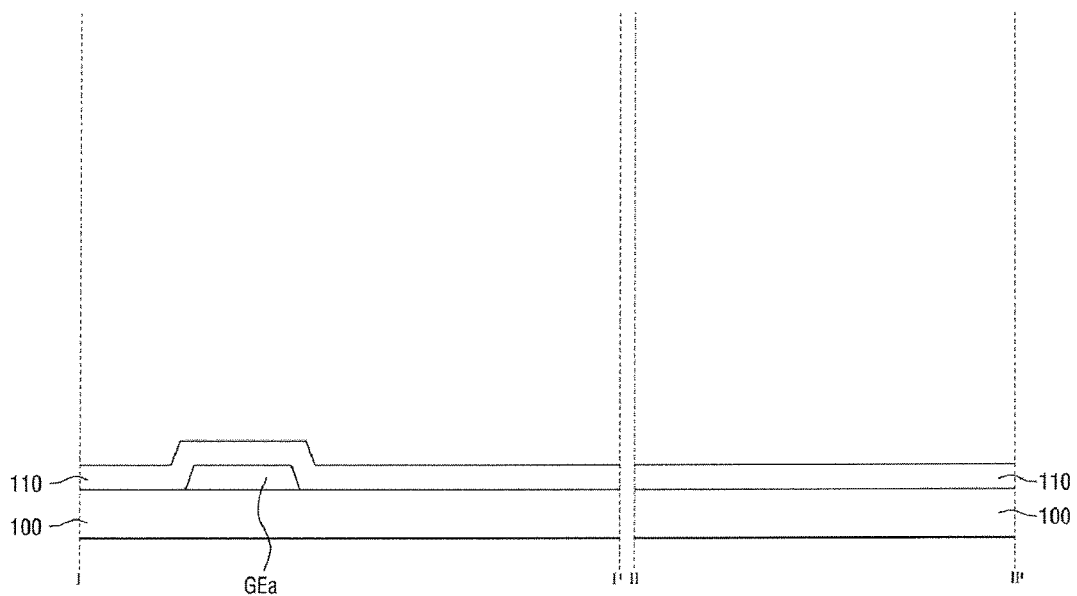

Referring to FIGS. 2, 3, and 5, the gate insulating layer 110 is formed on the first gate line Gn, the first gate electrode GEa, and the first substrate 100. In an exemplary embodiment of the invention, the gate insulating layer 110 may be formed by chemical vapor deposition (CVD), and may be formed not only on the display area DA of the first substrate 100, but also on the peripheral area PA of the first substrate 100 including the second peripheral area PA2.

Figure 6:
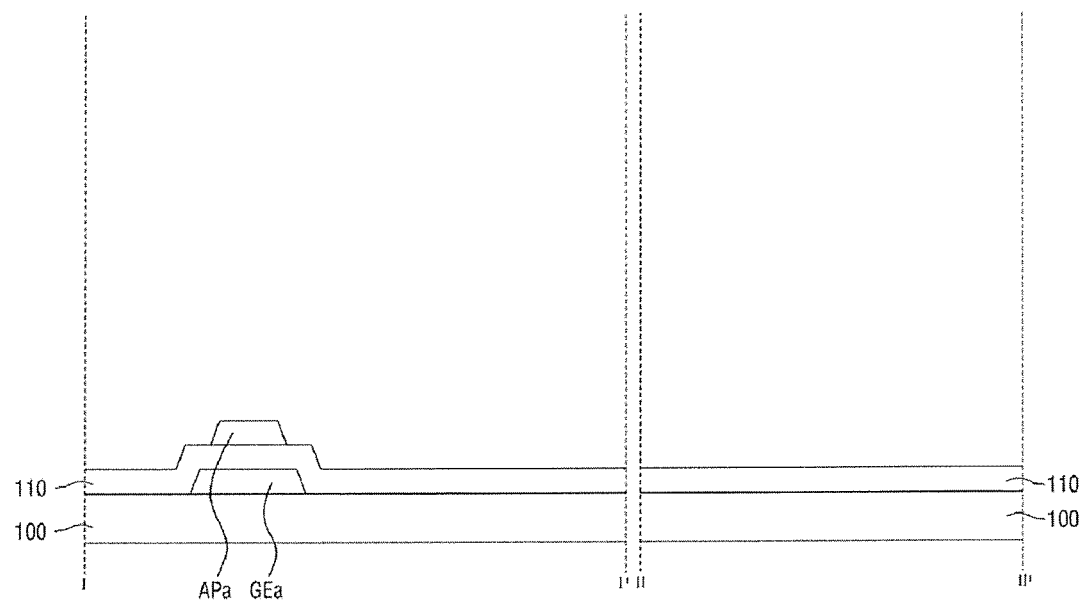

Referring to FIGS. 2, 3, and 6, the first active pattern APa, which overlaps the first gate electrode GEa, is formed by depositing an active layer on the gate insulating layer 110 and patterning the active layer.

Figure 7:
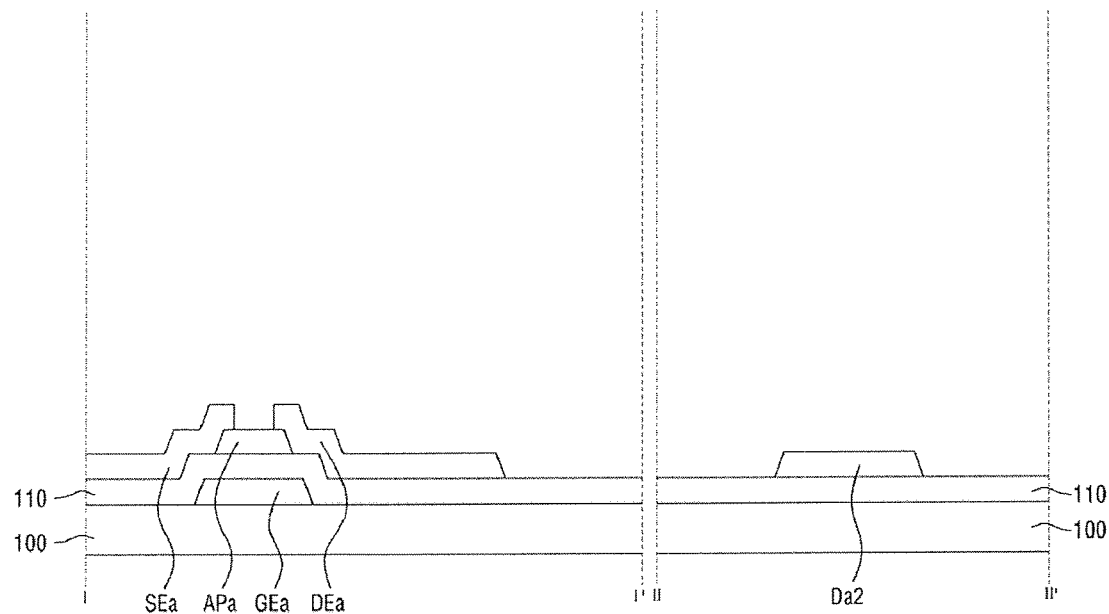

Referring to FIGS. 2, 3, and 7, the first data line Da, the first source electrode SEa, and the first drain electrode DEa are formed by forming a second metal layer on the first substrate 100 where the first active pattern APa is formed and patterning the second metal layer. As a result, the first TFT Ta including the first gate electrode GEa, the first active pattern APa, the first source electrode SEa, and the first drain electrode DEa is formed on the display area DA of the first substrate 100.

The first data line Da may include the first portion Da1, which is disposed on the display area DA of the first substrate 100, and the second portion Da2, which is disposed on the second peripheral area PA2 of the first substrate 100, as described above with reference to FIGS. 2 and 3. In an exemplary embodiment of the invention, the second metal layer may contain a metal such as Ag, Au, Cu, Ni, Pt, Pd, Ir, Rh, W, Al, Ta, Mo, Cd, Zn, Fe, Ti, Si, Ge, Zr, or Ba, an alloy of at least one of the metals, or a nitride of at least one of the metals.

Then, an open/short-circuit test for determining whether the first data line Da is open or short-circuited may be performed.

Figure 8A:
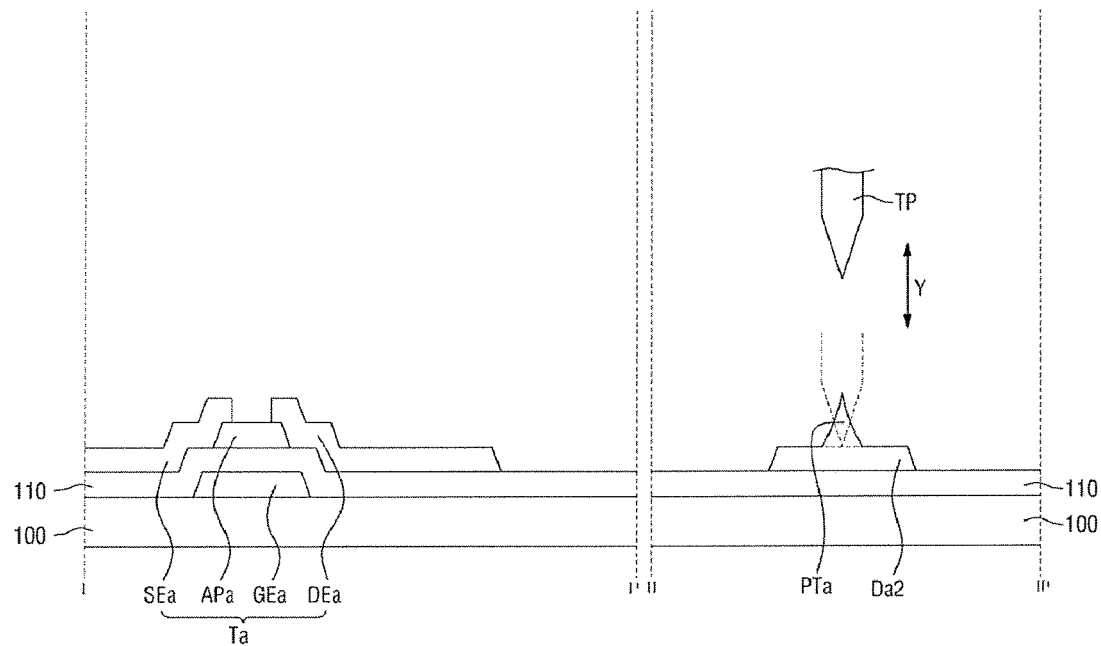

For example, as illustrated in FIG. 8A, the open/short-circuit test of the first data line Da may be performed on the first data line Da by moving a testing member TP, such as a probe pin, toward the second portion Da2 of the first data line Da in a third direction (e.g., an Y-axis direction) to contact the second portion Da2. A voltage may be applied to the second portion Da2 to measure the current properties of the second portion Da2. Accordingly, the open/short circuit test of the first data line Da may be performed in a contact manner. During the contact-based test of the first data line Da, the testing member TP may be placed in contact with the second portion Da2. As a result, the second portion Da2 may be physically damaged or deformed. Further, a burr or a spike such as the first protruding member PTa may be formed on the second portion Da2.

Figure 8B:
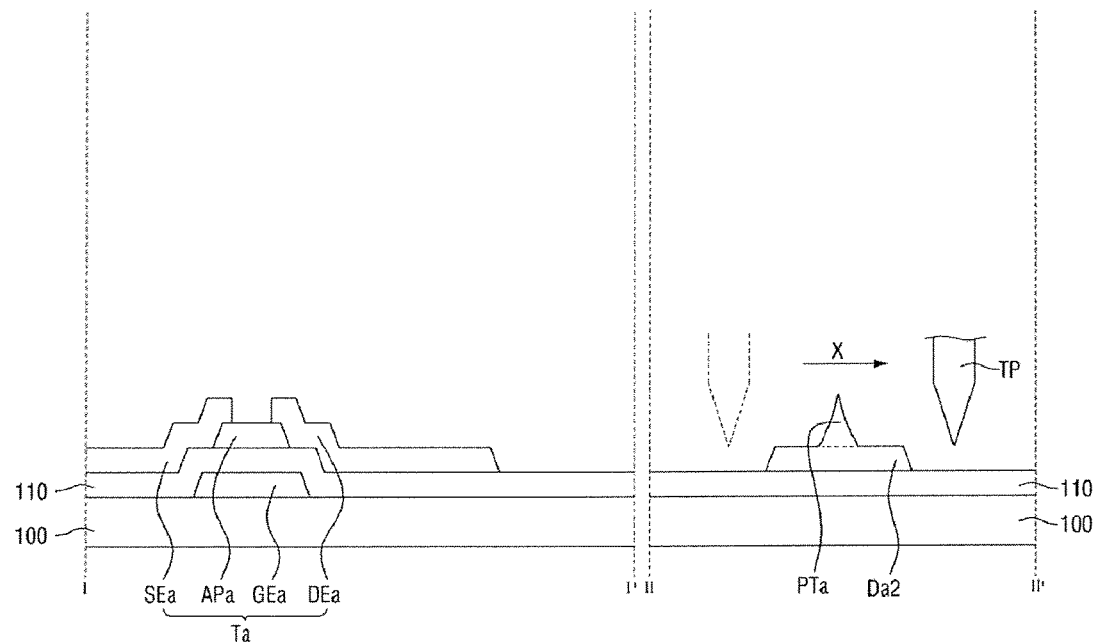

Alternatively, as illustrated in FIG. 8B, in response to an alternating current (AC) voltage being applied to the first data line Da and the testing member TP being moved over the second portion Da2 of the first data line Da in a fourth direction (e.g., an X-axis direction that crosses the third direction), a current may be induced due to a capacitive coupling. By measuring a magnetic field generated by the induced current, the open/short-circuit test of the first data line Da may be performed. Accordingly, the open/short-circuit test of the first data line Da may be performed in a contactless manner. During the contactless test of the first data line Da, the testing member TP may accidentally be placed in contact with the second portion Da2. As a result, the second portion Da2 may be physically damaged or deformed. Also, a burr or spike such as the first protruding member PTa may be formed on the second portion Da2.

Figure 9:
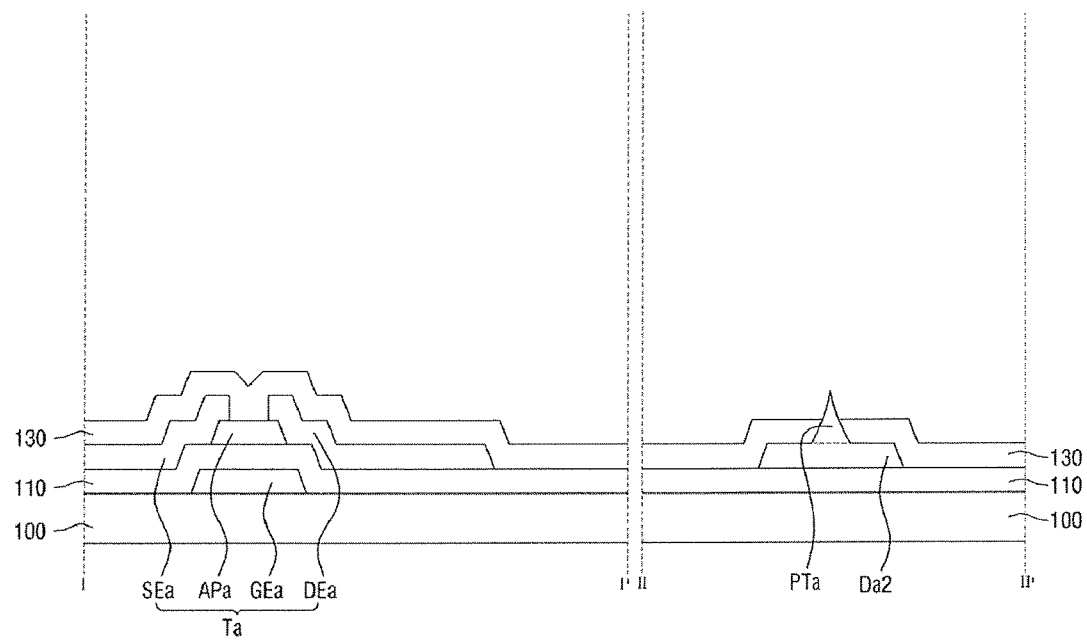

Referring to FIGS. 2, 3, and 9, the passivation layer 130 is formed by performing, for example, CVD on the first substrate 100 where the first TFT Ta is formed. For example, the passivation layer 130 may be formed of SiNx or $SiO_2$.

In an exemplary embodiment of the invention, when the first protruding pattern PTa is formed on the second portion Da2 of the first data line Da, the passivation layer 130 might not be able to cover the entire first protruding pattern PTa. For example, the first protruding pattern PTa may protrude from the second portion Da2, extend through the passivation layer 130, and extend beyond the top of the passivation layer 130.

Figure 10:
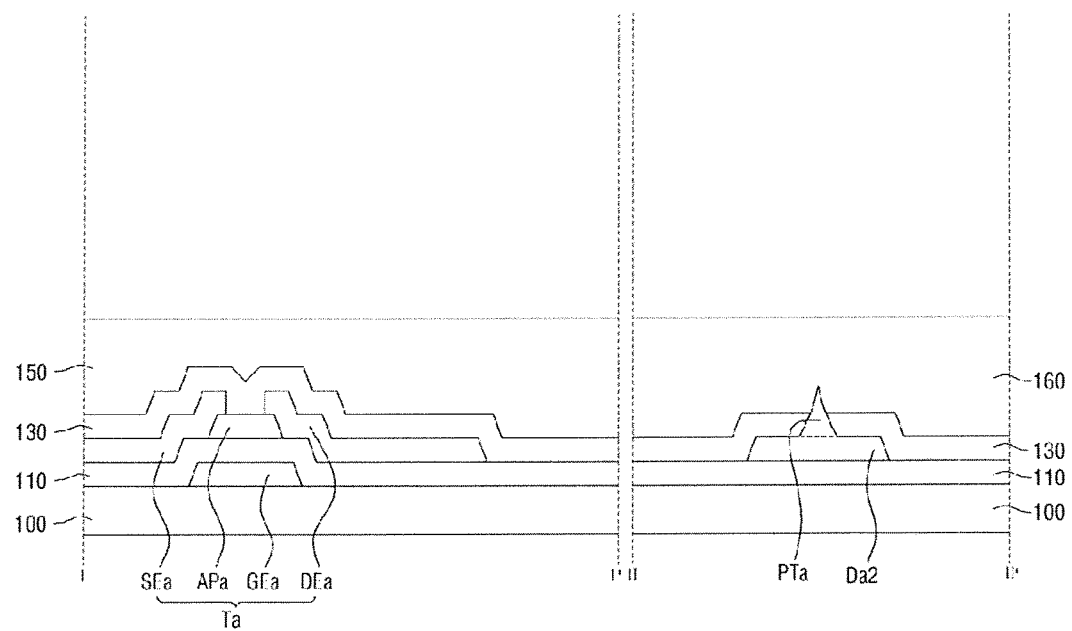

Referring to FIGS. 2, 3, and 10, the first and second insulating patterns 150 and 160 are formed by forming an organic insulating layer including a pigment on the passivation layer 130, and patterning the organic insulating layer. The first insulating pattern 150 may be formed on the display area DA of the first substrate 100, and may cover the first TFT Ta. The second insulating pattern 160 may be formed on the second peripheral area PA2 of the first substrate 100, and may completely cover the first protruding pattern PTa. In an exemplary embodiment of the invention, the organic insulating layer may be formed of a photosensitive organic composition, and may contain a pigment material.

Figure 11:
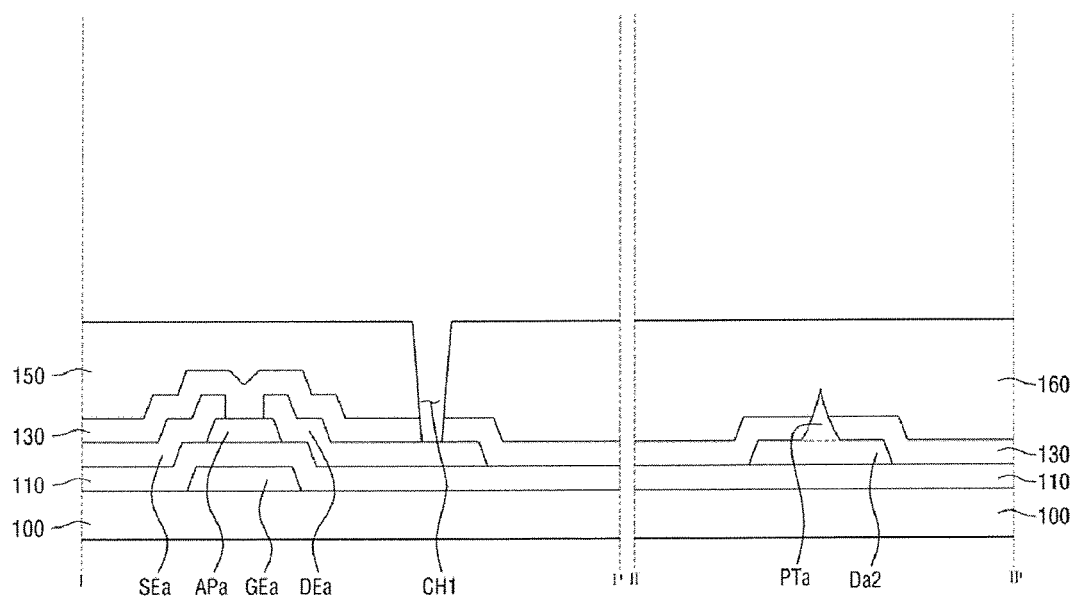

Referring to FIGS. 2, 3, and 11, the first contact hole CH1 is formed by etching the first and second insulating patterns 150 and 160. Part of the first drain electrode DEa is exposed through the first contact hole CH1.

Figure 12:
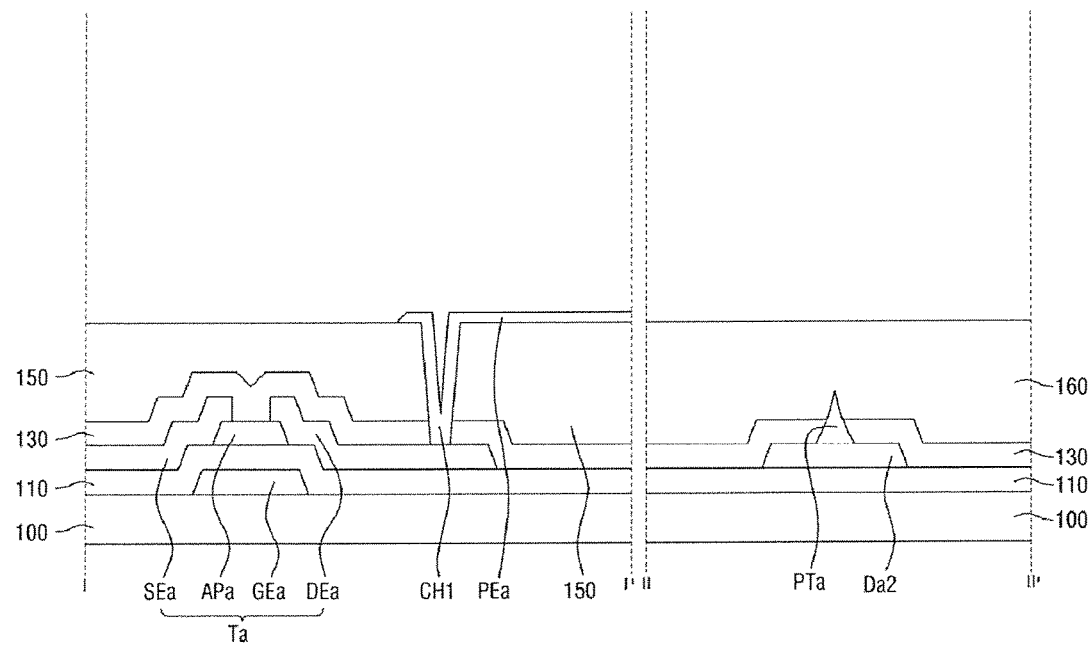

Referring to FIGS. 2, 3, and 12, the first pixel electrode PEa is formed by forming a transparent electrode layer on the first and second insulating patterns 150 and 160 where the first contact hole CH1 is formed and patterning the transparent electrode layer. The first pixel electrode PEa may be formed on the display area DA of the first substrate 100, and may be electrically connected to the first TFT Ta through the first contact hole CH1. For example, the transparent electrode layer may be formed of indium tin oxide (ITO) or indium zinc oxide (IZO).

Figure 13:
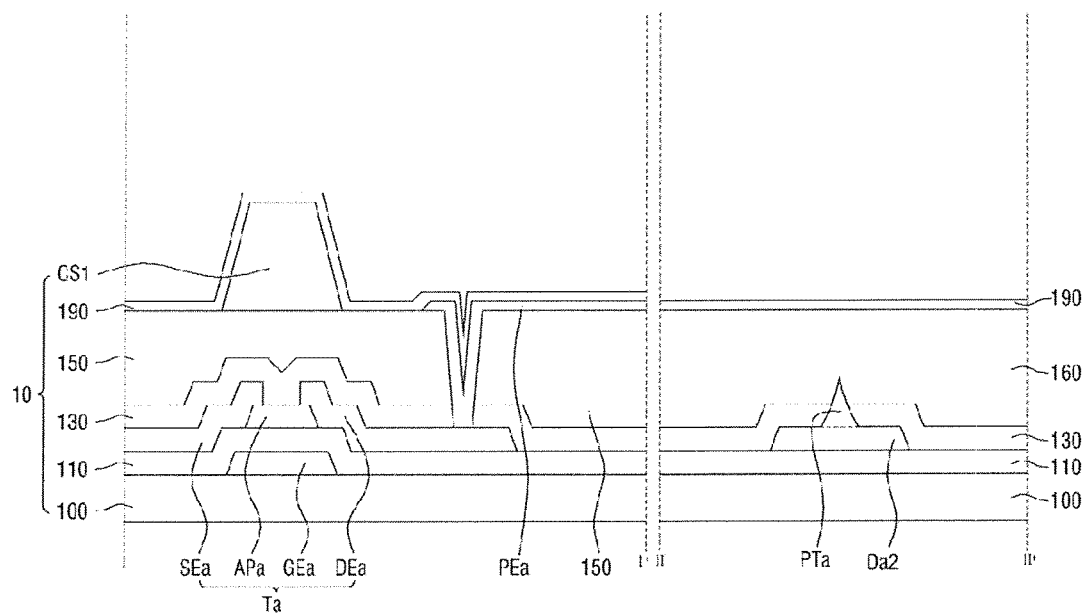

Referring to FIGS. 2, 3, and 13, the first cell gap spacer CS1 is formed by forming a photosensitive insulating layer on the first insulating pattern 150, the first pixel electrode PEa, and the second insulating pattern 160, and patterning the photosensitive insulating layer. The first cell gap spacer CS1 may be formed on the first insulating pattern 150 to overlap the first TFT Ta.

The first alignment layer 190 is formed on the first insulating pattern 150, the second insulating pattern 160, the first cell gap spacer CS1, and the first pixel electrode PEa. As a result, the array substrate 10 is obtained.

Figure 14:
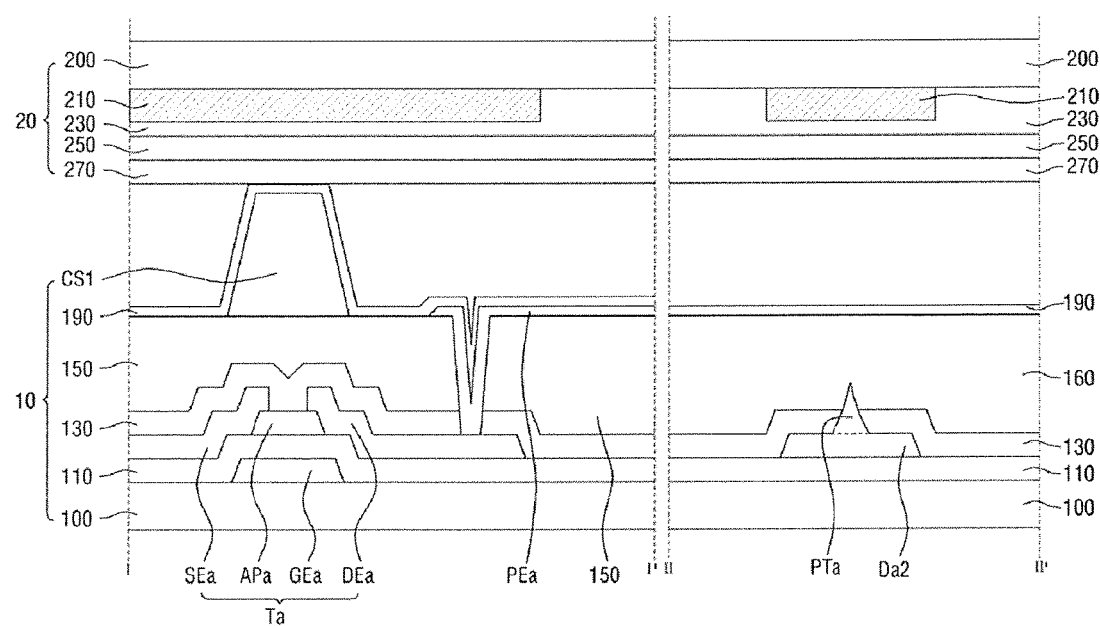

Referring to FIGS. 2, 3, and 14, the liquid crystal layer 300 is formed by disposing the opposite substrate 20 on the array substrate 10 and injecting a liquid crystal composition between the array substrate 10 and the opposite substrate 20. As a result, the display device 1 is obtained. The opposite substrate 20 may include the second substrate 200, the light-blocking member 210, the overcoat layer 230, the common electrode 250, and the second alignment layer 270. The elements of the opposite substrate 20 have already been described with reference to FIGS. 2 and 3. Thus, a repeated detailed description thereof may be omitted for brevity.

In the display device 1, the first protruding pattern PTa, which may be generated during an open/short-circuit test of the first data line Da, is completely covered by the second insulating pattern 160. As a result, any defects that may be caused by the first protruding pattern PTa may be prevented by covering the first protruding pattern PTa with the second insulating pattern 160. A defect may be caused when the first protruding pattern PTa may be placed in contact with the common electrode 250 due to a sagging opposite substrate 20, thus causing a contact failure. This problem may become more apparent when the array substrate 10 and the opposite substrate 20 are bent to realize a curved display device. However, in the display device 1, the second portion Da2 of the first data line Da, which is disposed in the peripheral area PA, is covered by the second insulating pattern 160. Accordingly a probability of occurrence of a contact failure is low. Accordingly, even when a burr or spike such as the first protruding pattern PTa is formed during the open/short-circuit test, the reliability of the display device 1 may be increased because the first protruding pattern PTa is completely covered by the second insulating pattern 160.

In addition, the second insulating pattern 160 can be formed during the formation of the first insulating pattern 150 without requiring any additional processes.

Figure 15:
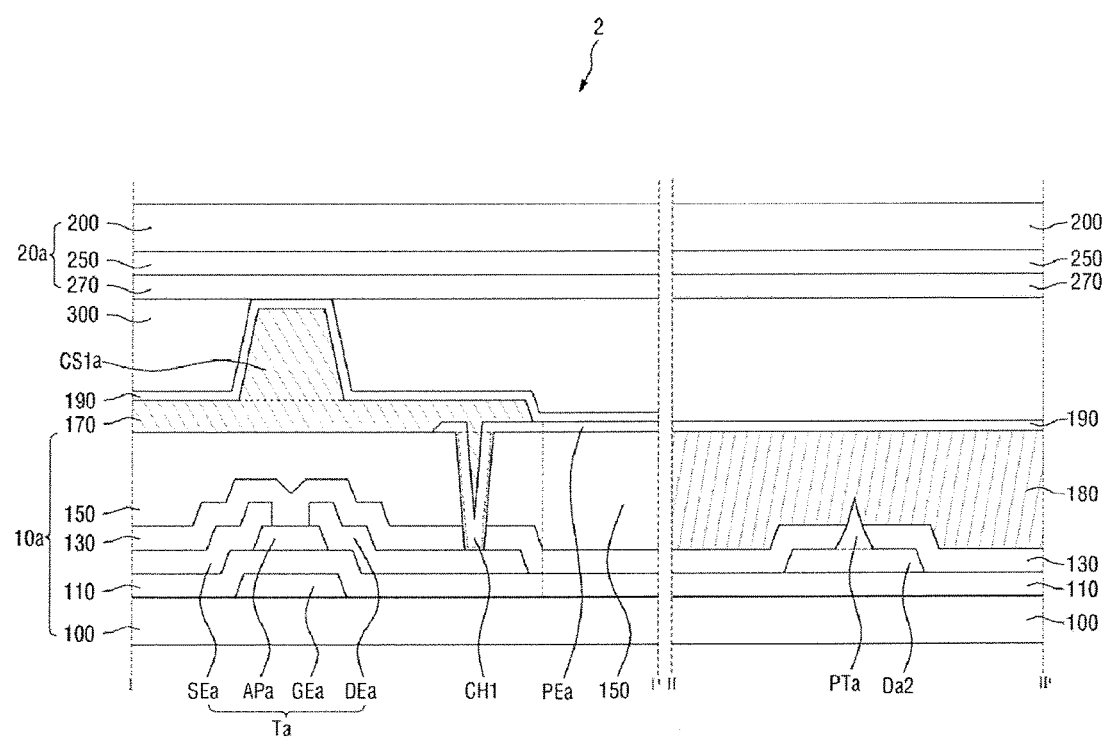
FIG. 15 is a cross-sectional view of a display device, according to an exemplary embodiment of the invention.

FIG. 15 is a cross-sectional view of a display device, according to an exemplary embodiment of the invention. FIG. 15 illustrates a cross-sectional view of a display device 2, according to an exemplary embodiment of the invention, taken along lines I-I' and II-II' of FIG. 2.

Referring to FIG. 15, the display device 2 is similar to the display device 1 of FIG. 3 except that in the display device 2, an array substrate 10a includes a light-blocking member 170. An opposite substrate 20a might not include the light-blocking member 170. Accordingly, the display device 2 will be described hereinafter with focus on differences with the display device 1.

The display device 2 may include the array substrate 10a, the opposite substrate 20a, which faces the array substrate 10a, and a liquid crystal layer 300 interposed between the array substrate 10a and the opposite substrate 20a.

The array substrate 10a may include the first substrate 100, the gate insulating layer 110, the first gate line Gn, the first data line Da, a first TFT Ta which is a switching device, the passivation layer 130, the first insulating pattern 150, a second insulating pattern 180, the first pixel electrode PEa, a first cell gap spacer CS a, and a first alignment layer 190.

The first substrate 100, the gate insulating layer 110, the first gate line Gn, the first data line Da, the first TFT Ta, the passivation layer 130, the first insulating layer 150, and the first pixel electrode PEa are similar to their respective counterparts of FIGS. 2 and 3. Thus, detailed descriptions thereof may be omitted for brevity.

The light-blocking member 170 may be disposed on the first insulating pattern 150. The light-blocking member 170 may be disposed to overlap the first gate line Gn, the first data line Da, and the first TFT Ta. In an exemplary embodiment of the invention, at least part of the light-blocking member 170 may overlap the first pixel electrode PEa, and may be disposed in a first contact hole CH1.

The first cell gap spacer CS1a may be disposed on the light-blocking member 170. The first cell gap spacer CS1 may maintain a gap between the array substrate 10a and the opposite substrate 20a. The first cell gap spacer CS1a may be disposed to at least partially overlap the first TFT Ta.

The light-blocking member 170 and the first cell gap spacer CS1a may be integrally formed using the same material. The light-blocking member 170 and the first cell gap spacer CS1a may be formed during the same process. In an exemplary embodiment of the invention, the light-blocking member 170 and the first cell gap spacer CS1a may be formed of a photosensitive organic composition including a light-blocking material, and may be formed at the same time using a halftone mask or a multi-tone mask. For example, the light-blocking material may be Cr, carbon (C), or Ti. However, the inventive concept is not limited thereto.

The second insulating pattern 180 may be disposed in the second peripheral area PA2 of the first substrate 100, and may cover at least part of the second portion Da2 of the first data line Da.

When the first protruding pattern PTa is disposed on the second portion Da2, the second insulating pattern 180 may cover the entire first protruding pattern PTa. For example, the first protruding pattern PTa may be completely covered by the second insulating pattern 180. Thus, the first protruding pattern PTa might not be exposed over the top of the second insulating pattern 160.

In an exemplary embodiment of the invention, the second insulating pattern 180 may be formed of the same material as the light-blocking member 170. The light-blocking member 170 and the second insulating pattern 180 may be formed during the same process. For example, the second insulating pattern 180, like the light-blocking member 170, may be formed of a photosensitive organic composition comprising a light-blocking material. The light-blocking member 170 and the second insulating pattern 180 may be formed by the same mask process. Since the light-blocking member 170 and the first cell gap spacer CS1a may be formed of the same material, the second insulating pattern 180 and the first cell gap spacer CS1a may also be formed of the same material.

The first alignment layer 190 may be disposed on the first insulating pattern 150, the first cell gap spacer CS1a, the light-blocking member 170, the first pixel electrode PEa, and the second insulating pattern 180. For example, the first alignment layer 190 may be formed on the entire surface of the array substrate 10a. Part of the first alignment layer 190 on the first cell gap spacer CS1 may at least partially contact the opposite substrate 20a.

The opposite substrate 20a may include the second substrate 200, the common electrode 250, and the second alignment layer 270.

The common electrode 250 may be formed on the second substrate 200. The common electrode 250 may be formed of a transparent conductive material.

The second alignment layer 270 may be formed on the second substrate 200 where the common electrode 250 is formed. The second alignment layer 270 may be formed on the entire surface of the opposite substrate 20a facing the array substrate 10a.

FIGS. 16 to 21 are cross-sectional views illustrating a method of fabricating the display device of FIG. 15, according to an exemplary embodiment of the invention.

Referring to FIGS. 2, 4 to 9, and 15 to 21, the first gate line Gn, the first gate electrode GEa, the gate insulating layer 110, the first active pattern APa, the first data line Da, the first source electrode SEa, and the first drain electrode DEa are formed in the same manner as described above with reference to FIGS. 4 to 7. An open/short-circuit test of the first drain electrode DEa may be performed in the same manner as described above with reference to FIGS. 8A and 8B. The passivation layer 130 may be formed in the same manner as that described above with reference to FIG. 9.

Figure 16:
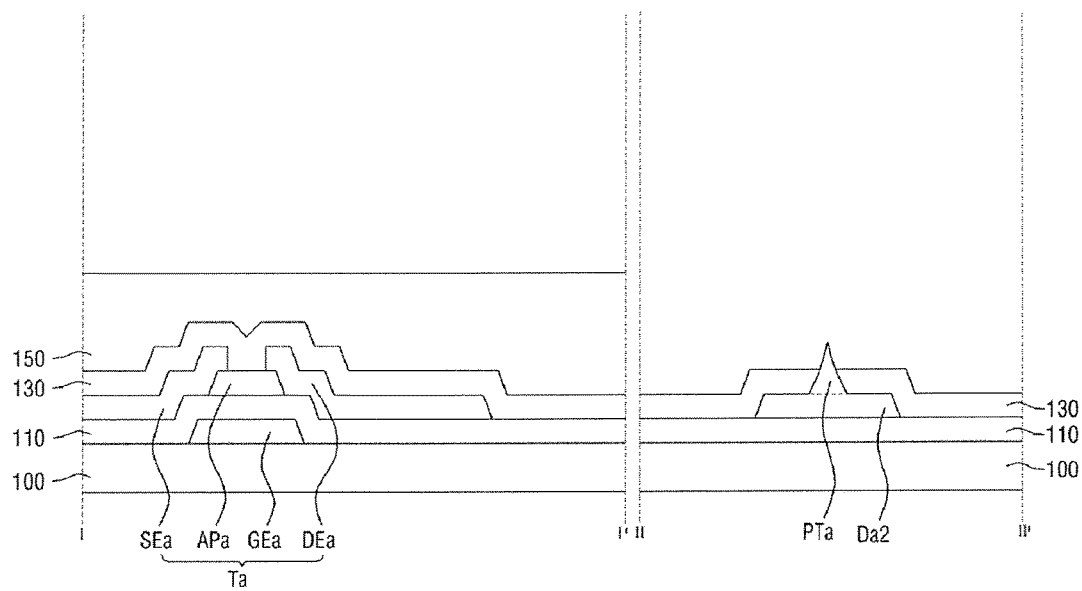
FIGS. 16 to 21 are cross-sectional views illustrating a method of fabricating the display device illustrated in FIG. 15, according to an exemplary embodiment of the invention.

Referring to FIGS. 15, and 16, the first insulating pattern 150 is formed by forming an organic insulating layer on the passivation layer 130 and patterning the organic insulating layer. The first insulating pattern 150 may be formed on the display area DA of the first substrate 100, and may cover the first TFT Ta. In an exemplary embodiment of the invention, the organic insulating layer may be formed of a photosensitive organic composition or a color filter material.

Figure 17:
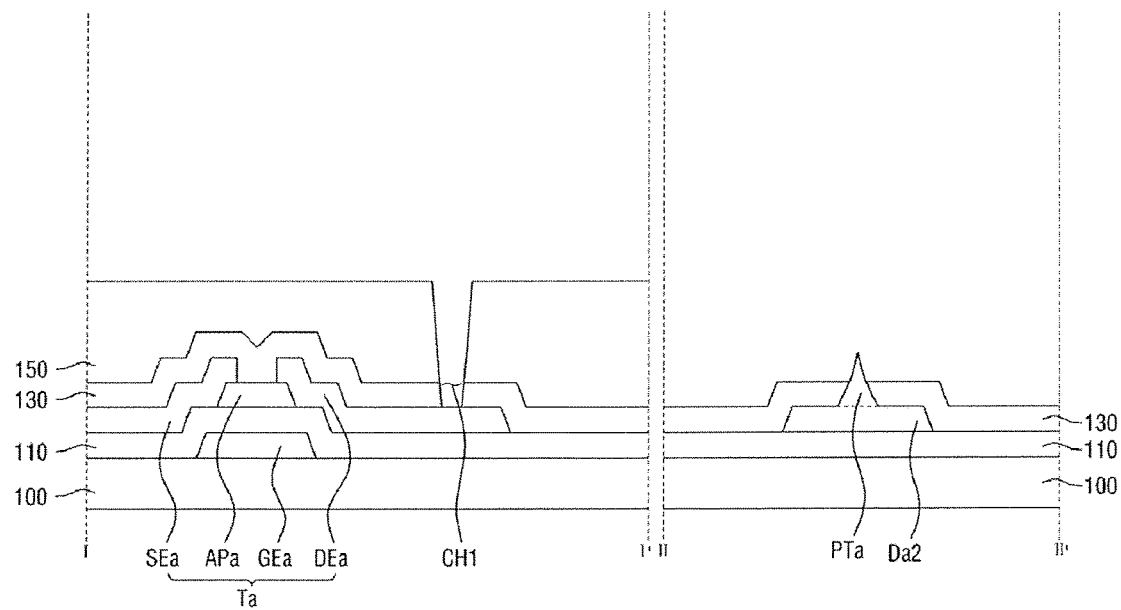

Referring to FIGS. 2, 15, and 17, the first contact hole CH1 is formed by etching the first insulating pattern 150 and the passivation layer 130. Part of the first drain electrode DEa is exposed through the first contact hole CH1.

Figure 18:
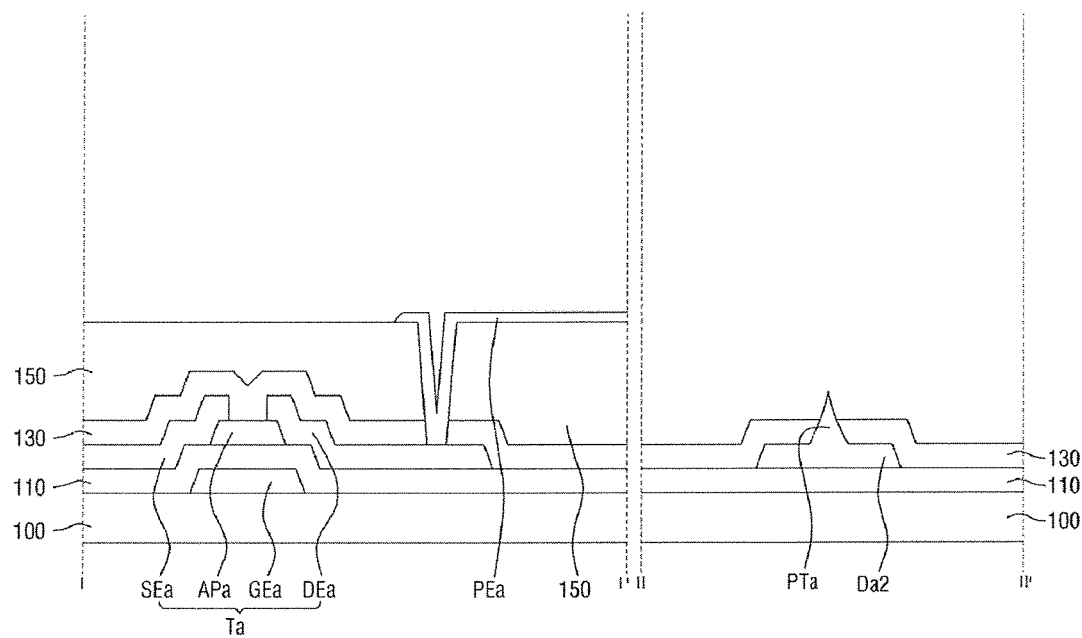

Referring to FIGS. 2, 15, and 18, the first pixel electrode PEa is formed by forming a transparent electrode layer on the first insulating pattern 150 where the first contact hole CH1 is formed and patterning the transparent electrode layer. The first pixel electrode PEa may be formed on the display area DA of the first substrate 100, and may be electrically connected to the first TFT Ta through the first contact hole CH1. For example, the transparent electrode layer may be formed of ITO or IZO.

Figure 19:
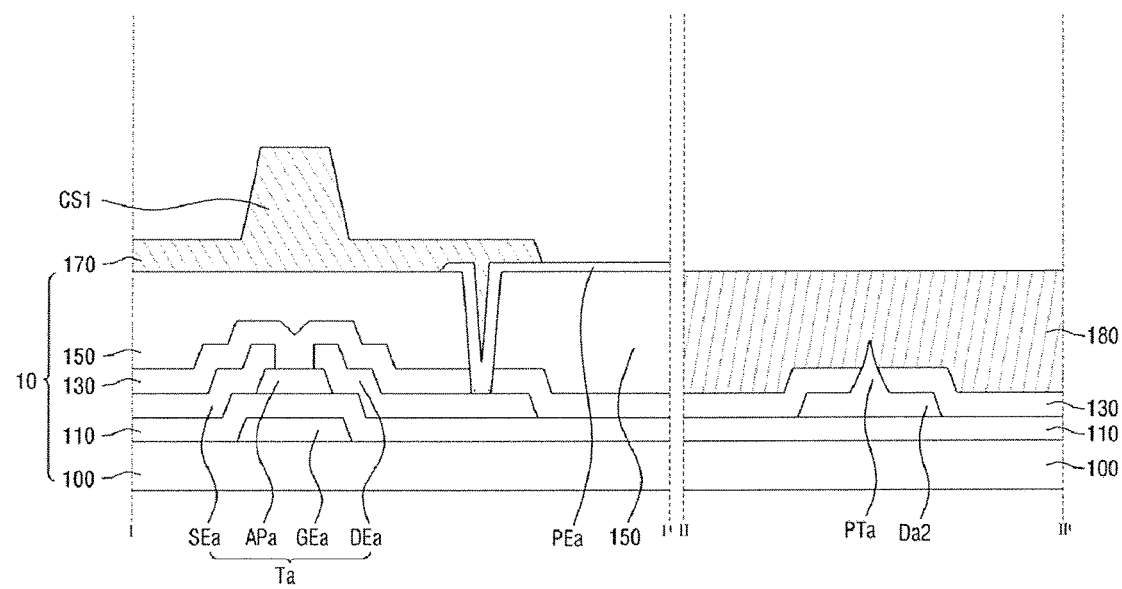

Referring to FIGS. 2, 15, and 19, the light-blocking member 170, the first cell gap spacer CS1a, and the second insulating pattern 180 are formed by forming a photosensitive insulating layer on the first insulating pattern 150, the first pixel electrode PEa, the passivation layer 130, and the first protruding pattern PTa, and by patterning the photosensitive insulating layer using a halftone mask or a multi-tone mask. The photosensitive insulating layer may be formed of a photosensitive organic composition comprising a light-blocking material. The light-blocking member 170 may be formed to overlap the first gate line Gn, the first data line Da, and the first TFT Ta. The second insulating pattern 180 may be formed on the second peripheral area PA2 of the first substrate 100 to completely cover the first protruding pattern PTa. The second insulating pattern 180 may be formed not only on the second peripheral area PA2 of the first substrate 100, but also on the rest of the peripheral area PA of the first substrate 100.

Figure 20:
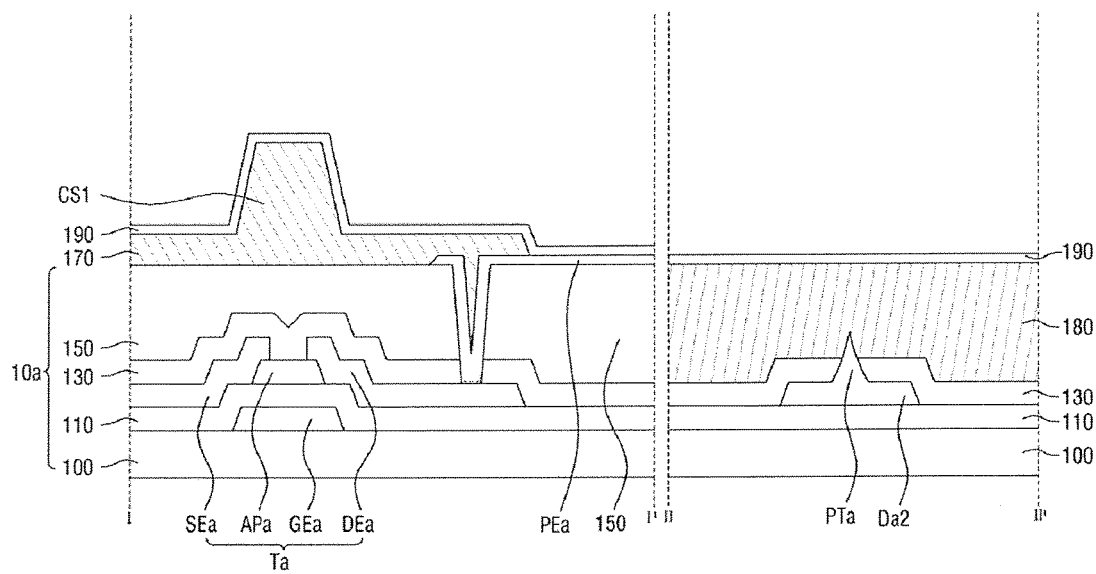

Referring to FIGS. 2, 15, and 20, the first alignment layer 190 is formed on the first insulating pattern 150, the second insulating pattern 180, the light-blocking member 170, the first cell gap spacer CS1a, and the first pixel electrode PEa. As a result, the array substrate 10a is obtained.

Figure 21:
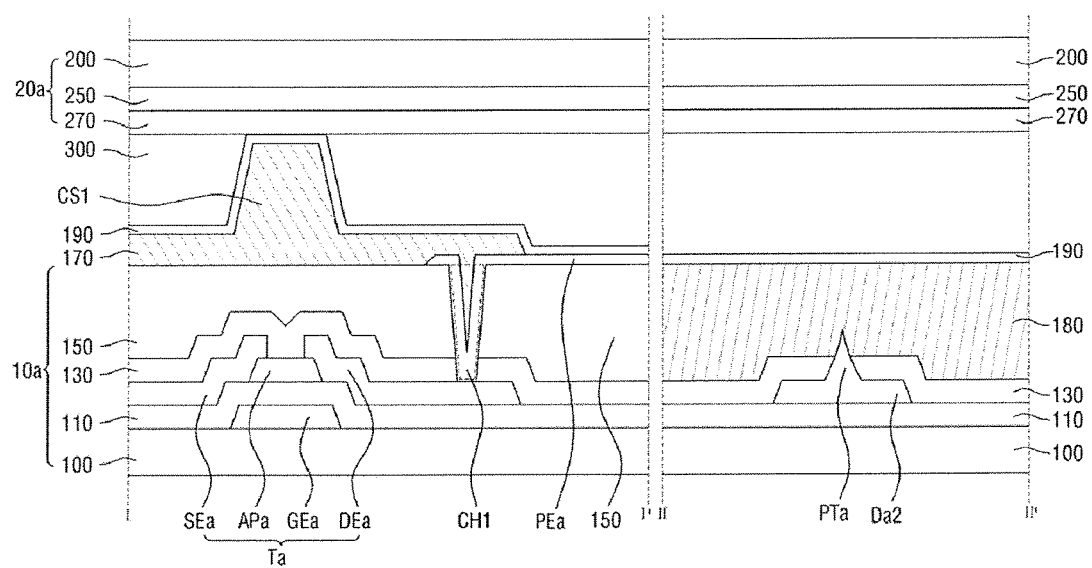

Referring to FIGS. 2, 3, and 21, the opposite substrate 20a is disposed on the array substrate 10a, and a liquid crystal composition which forms the liquid crystal layer 300 is injected between the array substrate 10a and the opposite substrate 20a. As a result, the display device 2 is obtained. The opposite substrate 20a may include the second substrate 200, the common electrode 250, and the second alignment layer 270. The elements of the opposite substrate 20a have been described with reference to FIGS. 2, 3, and 15. Thus, detailed descriptions thereof may be omitted for brevity.

According to an exemplary embodiment of the invention, even if a burr or spike such as the first protruding pattern PTa is formed during an open/short-circuit test, the reliability of the display device 2 may be increased because the first protruding pattern PTa is completely covered by the second insulating pattern 180. Also, since the second insulating pattern 180, the light-blocking member 170, and the first cell gap spacer CS1a may be formed at the same time, process efficiency may be increased.

Figure 22:
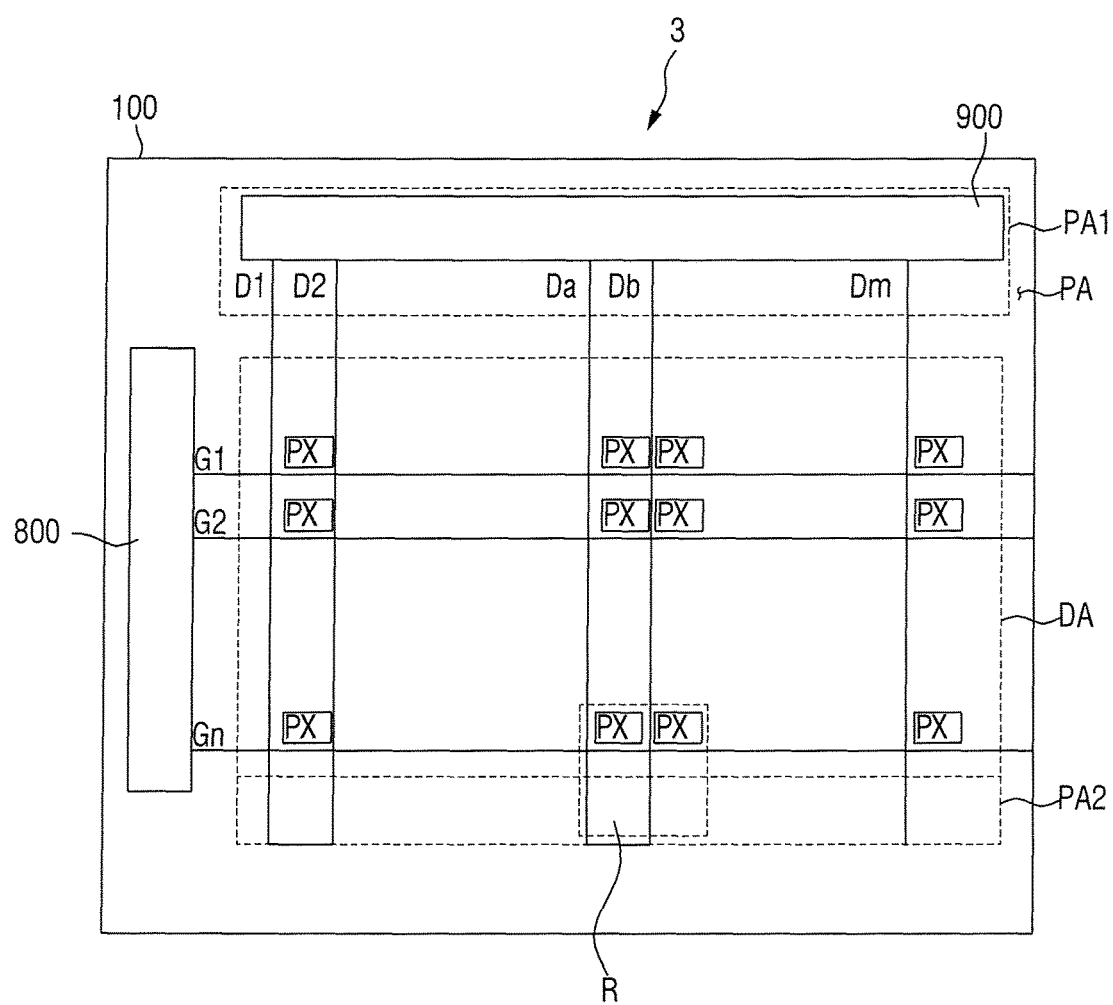
FIG. 22 is a layout view of a display device, according to an exemplary embodiment of the invention.

FIG. 22 is a layout view of a display device, according to an exemplary embodiment of the invention.

Referring to FIG. 22, a display device 3 may include an array substrate and an opposite substrate which faces the array substrate. The array substrate may include the first substrate 100, the plurality of gate lines G1, and G2 to Gn (e.g., the gate lines G1 to Gn, where n is a positive integer), the plurality of data lines D1 and D2 to Da, and Db to Dm (e.g., the data lines D1 to Dm, where a, b, and m are positive integers satisfying the following inequality: a<b<m). The data lines D1 to Dm are insulated from, and intersect the gate lines G1 to Gn. The array substrate may include the gate driving unit 800, and the data driving unit 900. The elements of the display device 3 are similar to their respective counterparts of FIG. 1. Thus, detailed descriptions thereof may be omitted for brevity.

Figure 23:
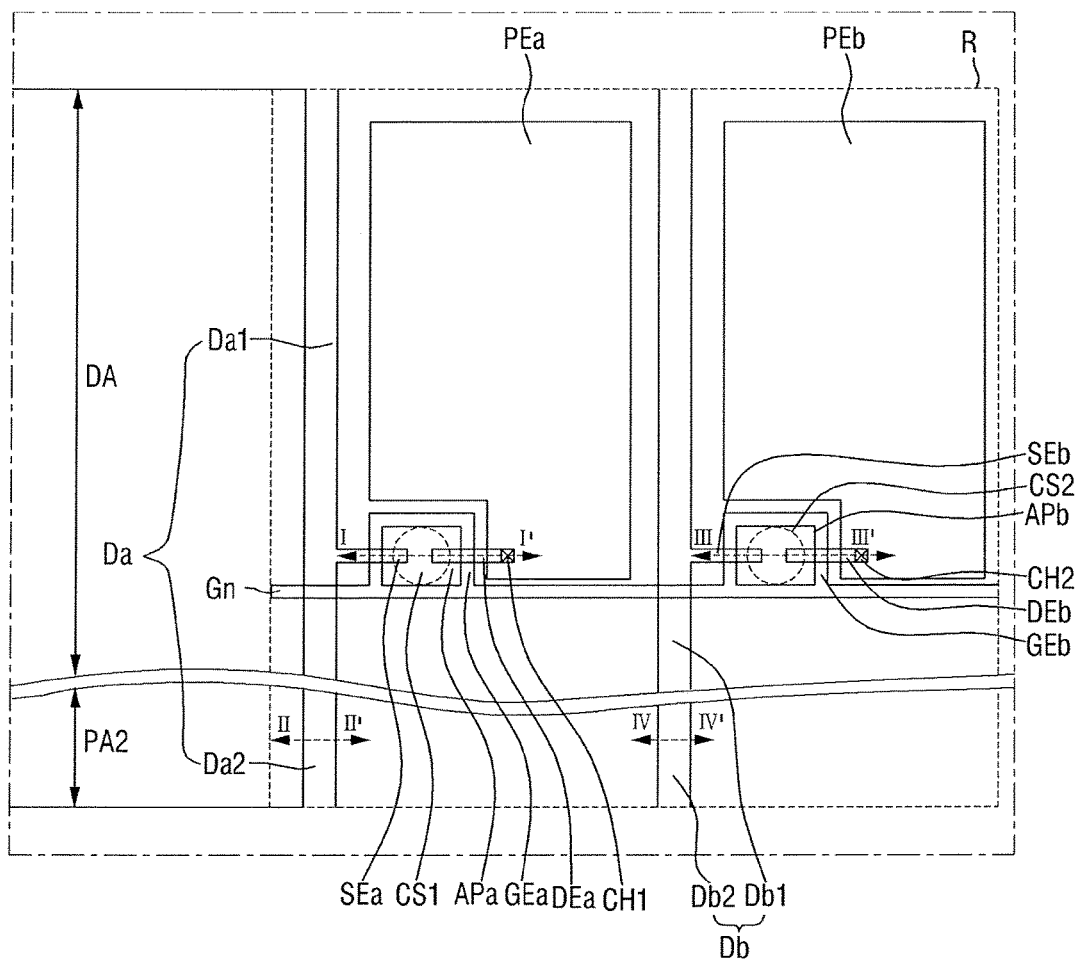
FIG. 23 is an enlarged plan view of part R of FIG. 22, according to an exemplary embodiment of the invention.
Figure 24:
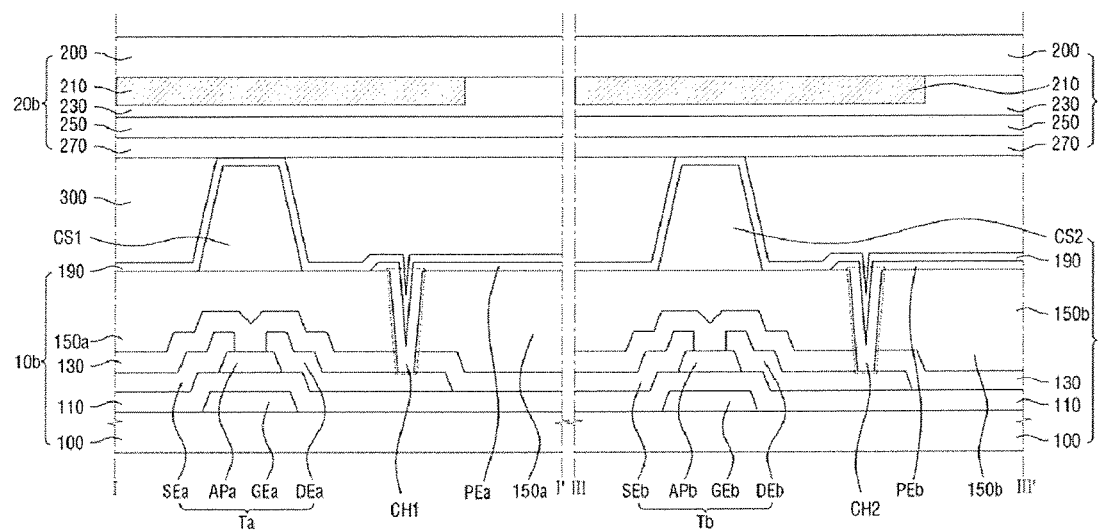
FIG. 24 is a cross-sectional view taken along lines I-I' and III-III' of FIG. 23, according to an exemplary embodiment of the invention.
Figure 25:
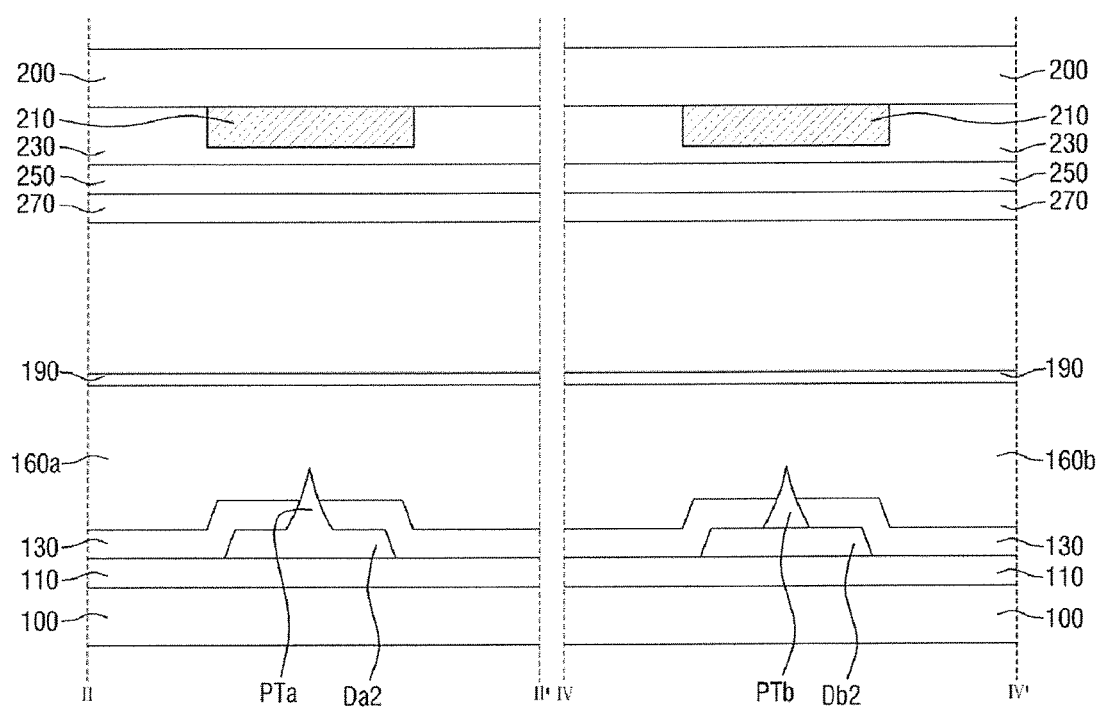
FIG. 25 is a cross-sectional view taken along lines II-II' and IV-IV' of FIG. 23, according to an exemplary embodiment of the invention.

FIG. 23 is an enlarged plan view of part R of FIG. 22, according to an exemplary embodiment of the invention. FIG. 23 illustrates an enlarged plan view illustrating two pixels PX and part of the second peripheral area PA2. FIG. 24 is a cross-sectional view taken along lines I-I' and III-III' of FIG. 23, according to an exemplary embodiment of the invention. FIG. 25 is a cross-sectional view taken along lines II-II' and IV-IV' of FIG. 23, according to an exemplary embodiment of the invention. In FIGS. 1 to 3 and 23 to 25, like reference numerals may indicate like elements. Thus, detailed descriptions of elements already described may be omitted for brevity or brief descriptions thereof may be provided.

Referring to FIGS. 23 to 25, the display device 3 may include an array substrate 10b, an opposite substrate 20b which faces the array substrate 10b, and a liquid crystal layer 300 disposed between the array substrate 10b and the opposite substrate 20b.

The array substrate 10b may include the first substrate 100, the gate insulating layer 110, the first gate line Gn, the first data line Da, a second data line Db, the first TFT Ta, a second TFT Tb, the passivation layer 130, a first insulating pattern 150a, a second insulating pattern 150b, a third insulating pattern 160a, a fourth insulating pattern 160b, the first pixel electrode PEa, a second pixel electrode PEb, the first cell gap spacer CS1, a second cell gap spacer CS2, and the first alignment layer 190.

The first substrate 100 may be a transparent insulating substrate. In an exemplary embodiment of the invention, the first substrate 100 may be flexible, as mentioned above with reference to FIG. 1.

The first substrate 100 may include the display area DA and the peripheral area PA. The peripheral area PA includes the first peripheral area PA1 and the second peripheral area PA2.

The first gate line Gn may extend on the first substrate 100 in the first direction (e.g., the horizontal direction, as illustrated in FIGS. 23 to 25).

The gate insulating layer 110 may be formed on the first substrate 100 to cover the first gate line Gn. The gate insulating layer 110 may be disposed not only on the display area DA, but also on the second peripheral area PA2 of the first substrate 100.

The first and second data lines Da and Db may be disposed on the gate insulating layer 110, and may extend in the second direction (e.g., the vertical direction, as illustrated in FIGS. 23 to 25), which crosses the first direction. The first and second data lines Da and Db may be insulated from, and intersect the first gate line Gn. The first and second data lines Da and Db may be disposed on the display area DA of the first substrate 100, and may at least partially extend into the peripheral area PA of the first substrate 100. The first data line Da may include the first portion Da1, which is disposed in the display area DA of the first substrate 100, and the second portion Da2, which is connected to the first portion Da1. The second portion Da2 of the first data line Da is disposed in the second peripheral area PA2 of the first substrate 100. Similarly, the second data line Db may include a first portion Db1, which is disposed in the display area DA of the first substrate 100, and a second portion Db2, which is connected to the first portion Db1. The second portion Db2 of the second data line Db is disposed in the second peripheral area PA2 of the first substrate 100.

In an exemplary embodiment of the invention, the first protruding pattern PTa may be disposed on the second portion Da2 of the first data line Da, or a second protruding pattern PTb may be disposed on the second portion Db2 of the second data line Db. The first and second protruding patterns PTa and PTb may be burrs or spikes formed during an open/short-circuit test of the first and second data lines Da and Db, respectively. The first protruding pattern PTa and the first data line Da may be formed of the same material, and the second protruding pattern PTb and the second data line Db may be formed of the same material.

The first and second TFTs Ta and Tb may be disposed on the display area DA of the first substrate 100. The first TFT Ta may include the first gate electrode GEa which is connected to the first gate line Gn, the first active pattern APa which overlaps the first gate electrode GEa and is disposed on the gate insulating layer 110, the first source electrode SEa which is connected to the first portion Da1 of the first data line Da and is disposed on the first active pattern APa to overlap the first active pattern APa. The first TFT Ta may include the first drain electrode DEa which is disposed on the first active pattern APa to overlap the first active pattern APa. Similarly, the second TFT Tb may include a second gate electrode GEb which is connected to the first gate line Gn, and a second active pattern APb which overlaps the second gate electrode GEb and is disposed on the gate insulating layer 110. The second TFT Tb may include a second source electrode SEb which is connected to the first portion Db1 of the second data line Db and is disposed on the second active pattern APb to overlap the second active pattern APb. The second TFT Tb may include and a second drain electrode DEb which is disposed on the second active pattern APb to overlap the second active pattern APb.

The passivation layer 130 may be disposed on the gate insulating layer 110 to cover the first data line Da, the second data line Db, the first source electrode SEa, the first drain electrode DEa, the second source electrode SEb, and the second drain electrode Deb. The passivation layer 130 may also cover the second portion Da2 of the first data line Da and/or the second portion Db2 of the second data line Db on the second peripheral area PA2 of the first substrate 100. In an exemplary embodiment of the invention, the passivation layer 130 might not completely cover the first protruding pattern PTa and/or the second protruding pattern PTb.

The first insulating pattern 150a may be disposed on the display area DA of the first substrate 100 and may cover the first TFT Ta. The second insulating pattern 150b may be disposed on the display area DA of the first substrate 100 and may cover the second TFT Tb. In an exemplary embodiment of the invention, the first and second insulating patterns 150a and 150b may be disposed on the passivation layer 130.

In an exemplary embodiment of the invention, the first insulating pattern 150a may be formed of an organic insulating material, and the organic insulating material may contain a photosensitive organic composition. The first insulating pattern 150a may be a first color filter. For example, the first color filter may be one of red, green and blue color filters.

In an exemplary embodiment of the invention, the second insulating pattern 150b may be formed of an organic insulating material, and the organic insulating material may contain a photosensitive organic composition. The second insulating pattern 150b may be a second color filter having a different color than the first color filter. For example, when the first color filter is a blue color filter, the second color filter may be a red color filter or a green color filter.

The third insulating pattern 160a may be disposed on the second peripheral area PA2 of the first substrate 100, and may cover at least part of the second portion Da2 of the first data line Da.

The first protruding pattern PTa that is disposed (e.g., formed) on the second portion Da2 of the first data line Da may be a burr or spike protruding above the passivation layer 130. When the first protruding pattern PTa that is disposed on the second portion Da2 of the first data line Da is the burr or spike protruding above the passivation layer 130, the third insulating pattern 160a may cover the entire first protruding pattern PTa. For example, the third insulating pattern 160a may completely cover the first protruding pattern PTa regardless of whether it protrudes above the passivation layer 130. Thus, the first protruding pattern PTa may be completely covered and not be exposed over the top of the third insulating pattern 160a.

Similar to the third insulating pattern 160a, the fourth insulating pattern 160b may be disposed on the second peripheral area PA2 of the first substrate 100, and may cover at least part of the second portion Db2 of the second data line Db.

The second protruding pattern PTb that is disposed on the second portion Db2 of the second data line Db may be a burr or spike protruding above the passivation layer 130. When the second protruding pattern PTb that is disposed on the second portion Db2 of the second data line Db is the burr or spike protruding above the passivation layer 130, the fourth insulating pattern 160b may cover the entire second protruding pattern PTh. For example, the fourth insulating pattern 160b may completely cover the second protruding pattern PTb regardless of whether it protrudes above the passivation layer 130. Thus, the second protruding pattern PTb may be completely covered and not be exposed over the top of the fourth insulating pattern 160b.

In an exemplary embodiment of the invention, the third and fourth insulating patterns 160a and 160b may be formed of the same material as the first insulating pattern 150a. The first, third, and fourth insulating patterns 150a, 160a, and 160b may be formed during the same process. When the first insulating pattern 150a is implemented as a first color filter, the third and fourth insulating patterns 160a and 160b may also be implemented as first color filters. Also, when the first insulating pattern 150a is formed by applying a photosensitive organic composition including a pigment rendering a first color and patterning the photosensitive organic composition using a mask, the third and fourth insulating patterns 160a and 160b may be formed by the same mask process as the first insulating pattern 150a.

Alternatively, the third insulating pattern 160a may be formed of the same material as the first insulating pattern 150a, and the fourth insulating pattern 160b may be formed of the same material as the second insulating pattern 150b. The first and third insulating patterns 150a and 160a may be formed during the same process, and the second and fourth insulating patterns 150b and 160b may be formed during the same process. For example, when the first insulating pattern 150a is implemented as a first color filter, the third insulating pattern 160a may also be implemented as the first color filter. The third insulating pattern 160a and the first insulating pattern 150a may be formed by the same mask process. Similarly, when the second insulating pattern 150b is implemented as a second color filter having a different color from a first color filter, the fourth insulating pattern 160b may also be implemented as the second color filter. The fourth insulating pattern 160b and the second insulating pattern 150b may be formed by the same mask process.

Alternatively, the third insulating pattern 160a may be formed of the same material as the second insulating pattern 150b, and the fourth insulating pattern 160b may be formed of the same material as the first insulating pattern 150a. The first and fourth insulating patterns 150a and 160b may be formed during the same process. The second and third insulating patterns 150b and 160a may be formed during the same process. For example, when the first insulating pattern 150a is implemented as a first color filter, the fourth insulating pattern 160b may also be implemented as the first color filter, and the fourth insulating pattern 160b and the first insulating pattern 150a may be formed by the same mask process. Similarly, when the second insulating pattern 150b is implemented as a second color filter having a different color from a first color filter, the third insulating pattern 160a may also be implemented as the second color filter. The third insulating pattern 160a and the second insulating pattern 150b may be formed by the same mask process.

The first pixel electrode PEa may be disposed on the first insulating pattern 150a, and may be formed of a transparent conductive material. The first pixel electrode PEa may contact the first drain electrode DEa through the first contact hole CH1, which penetrates the first insulating pattern 150a and the passivation layer 130. Accordingly, the first pixel electrode PEa may be electrically connected to the first TFT Ta.

Similarly, the second pixel electrode PEb may be disposed on the second insulating pattern 150b, and may be formed of a transparent conductive material. The second pixel electrode PEb may contact the second drain electrode DEb through a second contact hole CH2, which penetrates the second insulating pattern 150b and the passivation layer 130. Accordingly, the second pixel electrode PEb may be electrically connected to the second TFT Tb.

The first cell gap spacer CS1 may be disposed on the first insulating pattern 150a, and the second cell gap spacer CS2 may be disposed on the second insulating pattern 150b. The first and second cell gap spacers CS1 and CS2 may maintain a gap between the array substrate 10b and the opposite substrate 20b. In an exemplary embodiment of the invention, the first cell gap spacer CS1 may be disposed to at least partially overlap the first TFT Ta. Similarly, in an exemplary embodiment of the invention, the second cell gap spacer CS2 may be disposed to at least partially overlap the second TFT Tb.

The first alignment layer 190 may be disposed on the first insulating pattern 150a, the second insulating pattern 150b, the first cell gap spacer CS1, the second cell gap spacer CS2, the first pixel electrode PEa, the second pixel electrode PEb, the third insulating pattern 160a, and the fourth insulating pattern 160b. Part of the first alignment layer 190 disposed on the first and second cell gap spacers CS1 and CS2 may at least partially contact the opposite substrate 20b.

The opposite substrate 20b may include the second substrate 200 which faces the array substrate 10b, the light-blocking member 210, the overcoat layer 230, the common electrode 250, and the second alignment layer 270.

The second substrate 200, like the first substrate 100, may be a transparent insulating substrate.

The light-blocking member 210 may be disposed on a first surface of the second substrate 200 facing the array substrate 10b. The light-blocking member 210 may overlap the first gate line Gn, the first data line Da, the second data line Db, the first TFT Ta, the second TFT Tb, and the second peripheral area PA2.

The overcoat layer 230 may be formed on the light-blocking member 210 and the second substrate 200, and may planarize the opposite substrate 20b. In an exemplary embodiment of the invention, the overcoat layer 230 may be optional.

The common electrode 250 may be formed on the overcoat layer 230. The common electrode 250 may be formed of a transparent conductive material.

The second alignment layer 270 may be formed on the second substrate 200 where the common electrode 250 is formed.

The liquid crystal layer 300 may be interposed between the array substrate 10b and the opposite substrate 20b. The liquid crystal layer 300 may be formed of a liquid crystal composition including liquid crystal molecules.

According to an exemplary embodiment of the invention, even when the burr or spike such as the first and second protruding patterns PTa and PTb are formed during an open/short-circuit test, the reliability of the display device 3 may be increased because the first and second protruding patterns PTa and PTb are completely covered by the third and fourth insulating pattern 160a and 160b, respectively.

The third and fourth insulating pattern 160a and 160b may be formed without requiring any additional processes.

While the inventive concept has been particularly shown and described with reference to exemplary embodiments thereof, it will be understood by those of ordinary skill in the art that various changes may be made therein without departing from the spirit and scope of the invention as defined by the following claims. The exemplary embodiments of the invention should be considered in a descriptive sense only and not for purposes of limitation.

What is claimed is:

1. A display device, comprising:
a first substrate including a display area and a peripheral area disposed in a periphery of the display area;
a gate line disposed in the display area of the first substrate;
a data line insulated from the gate line and intersecting the gate line, the data line including a first portion and a second portion, wherein the first portion is disposed in the display area of the first substrate, the second portion is connected to the first portion and is disposed in the peripheral area of the first substrate;
a protruding pattern disposed directly on the second portion of the data line, the protruding pattern being a burr or spike of the data line;
a thin-film transistor (TFT) disposed in the display area of the first substrate and connected to the gate line and the data line;
a first insulating pattern disposed on the TFT; and
a second insulating pattern disposed in the peripheral area of the first substrate and covering the second portion of the data line and the protruding pattern;
wherein the second insulating pattern includes a same material as the first insulating pattern, and
wherein a width of the protruding pattern decreases along a direction from the second portion of the data line to an upper surface of the second insulating pattern.

2. The display device of claim 1, further comprising:
a passivation layer disposed in the display area and in the peripheral area of the first substrate, wherein the passivation layer is disposed between the TFT and the first insulation layer in the display area, and wherein the passivation layer is disposed between the second portion of the data line and the second insulating pattern in the peripheral area,
wherein a part of the protruding pattern passes through the passivation layer, and
wherein the second insulating pattern covers the part of the protruding pattern.

3. The display device of claim 2, wherein the protruding pattern includes a same material as the second portion of the data line.

4. The display device of claim 1, wherein the first insulating pattern is a color filter.

5. The display device of claim 1, further comprising:
a cell gap spacer disposed on the first insulating pattern, wherein the cell gap spacer overlaps the TFT.

6. The display device of claim 1, further comprising:
a pixel electrode disposed on the first insulating pattern and connected to the TFT through a contact hole, wherein the contact hole is formed in the first insulating pattern;
a second substrate facing the first substrate;
a light-blocking member disposed on a first surface of the second substrate, wherein the first surface of the second substrate faces the first substrate, and wherein the light-blocking member overlaps the TFT and the data line; and
a common electrode disposed on the first surface of the second substrate and the light-blocking member.

7. A display device, comprising:
a first substrate including a display area and a peripheral area disposed in a periphery of the display area;
a gate line disposed in the display area of the first substrate;
a data line insulated from the gate line and intersecting the gate line, the data line including a first portion and a second portion, wherein the first portion is disposed in the display area of the first substrate, and the second portion is connected to the first portion and is disposed in the peripheral area of the first substrate;
a thin-film transistor (TFT) disposed in the display area of the first substrate and connected to the gate line and the data line;
a first insulating pattern disposed on the TFT;
a light-blocking member disposed on the first insulating pattern, the light-blocking member overlapping the data line and the TFT, the light-blocking member including a light-blocking material;
a protruding pattern disposed directly on the second portion of the data line, the protruding pattern being a burr or spike of the data line;
a second insulating pattern disposed in the peripheral area of the first substrate and covering the second portion of the data line and the protruding pattern, wherein the second insulating pattern includes the light-blocking material; and
a passivation layer disposed in the display area and in the peripheral area of the first substrate, wherein the passivation layer is disposed between the TFT and the first insulation layer in the display area, and wherein the passivation layer is disposed between the second portion of the data line and the second insulating pattern in the peripheral area,
wherein a part of the protruding pattern passes through the passivation layer,
wherein the second insulating pattern covers the part of the protruding pattern, and
wherein a width of the protruding pattern decreases along a direction from the second portion of the data line to an upper surface of the second insulating pattern.

8. The display device of claim 7, wherein the protruding pattern includes a same material as the second portion.

9. The display device of claim 7, wherein the first insulating pattern is a color filter.

10. The display device of claim 7, further comprising:
a cell gap spacer disposed on the light-blocking member, wherein the cell gap spacer overlaps the TFT.

11. The display device of claim 10, wherein the cell gap spacer includes a same material as the light-blocking member.

12. The display device of claim 7, further comprising:
a pixel electrode disposed on the first insulating pattern and connected to the TFT through a contact hole, wherein the contact hole is formed in the first insulating pattern;
a second substrate facing the first substrate; and
a common electrode disposed on a first surface of the second substrate and the light-blocking member.

13. A display device, comprising:
a first substrate including a display area and a peripheral area disposed in a periphery of the display area;
a gate line disposed in the display area of the first substrate;
first and second data lines insulated from the gate line and intersecting the gate line,
wherein the first data line includes a first portion disposed in the display area of the first substrate, and a second portion connected to the first portion, wherein the second portion of the first data line is disposed in the peripheral area of the first substrate,
wherein the second data line includes a first portion disposed in the display area of the first substrate, and a second portion connected to the first portion, wherein the second portion of the second data line is disposed in the peripheral area of the first substrate;
a protruding pattern disposed directly on the second portion of the first data line, the protruding pattern being a burr or spike of the first data line;
a first thin-film transistor (TFT) disposed in the display area of the first substrate and connected to the gate line and the first data line;
a first insulating pattern disposed on the first TFT, the first insulating pattern including a first contact hole;
a first pixel electrode disposed on the first insulating pattern and connected to the first TFT through the first contact hole;
a second TFT disposed in the display area of the first substrate and connected to the gate line and the second data line;
a second insulating pattern disposed on the second TFT, the second insulating pattern including a second contact hole;
a second pixel electrode disposed on the second insulating pattern and connected to the second TFT through the second contact hole;
a third insulating pattern disposed in the peripheral area of the first substrate and covering the second portion of the first data line and the protruding pattern; and
a fourth insulating pattern disposed in the peripheral area of the first substrate and covering at least part of the second portion of the second data line,
wherein at least one of the third and fourth insulating patterns comprises a same material as the first insulating pattern, and
wherein a width of the protruding pattern decreases along a direction from the second portion of the data line to an upper surface of the second insulating pattern.

14. The display device of claim 13, further comprising:
a passivation layer disposed in the display area and in the peripheral area of the first substrate, wherein the passivation layer is disposed between the first TFT and the first insulating pattern in the display area, between the second TFT and the second insulating pattern in the display area, between the second portion of the first data line and the third insulating pattern in the peripheral area, and between the second portion of the second data line and the fourth insulating pattern in the peripheral area,
wherein a part of the protruding pattern passes through the passivation layer, and
wherein the third insulating pattern covers the part of the protruding pattern.

15. The display device of claim 14, wherein the protruding pattern includes a same material as the second portion of the first data line.

16. The display device of claim 13, wherein the first insulating pattern is a first color filter, and the second insulating pattern is a second color filter having a different color from the first color filter.

17. The display device of claim 16, wherein the third insulating pattern includes a same material as the first and fourth insulating patterns.

18. The display device of claim 16, wherein the third insulating pattern includes a same material as the first insulating pattern, and the fourth insulating pattern includes a same material as the second insulating pattern.

19. The display device of claim 16, wherein the third insulating pattern includes a same material as the second insulating pattern, and the fourth insulating pattern includes a same material as the first insulating pattern.

* * * * *